United States Patent [19]
Azuma et al.

[11] Patent Number: 6,049,475
[45] Date of Patent: Apr. 11, 2000

[54] POWER CONVERTING APPARATUS WITH DRIVE SIGNAL PATH IMPEDANCE INCREASING CIRCUITRY

[75] Inventors: Satoshi Azuma; Akinori Nishihiro; Masakatu Daijyo; Shigemi Kuriyama; Taro Ando, all of Tokyo, Japan

[73] Assignee: Mitsubishi Denki Kabushiki Kaisha, Tokyo, Japan

[21] Appl. No.: 09/171,708

[22] PCT Filed: Mar. 18, 1997

[86] PCT No.: PCT/JP97/00863

§ 371 Date: Apr. 6, 1999

§ 102(e) Date: Apr. 6, 1999

[87] PCT Pub. No.: WO98/42068

PCT Pub. Date: Sep. 24, 1998

[30] Foreign Application Priority Data

Mar. 18, 1997 [JP] Japan ..................................... 97/00863

[51] Int. Cl.[7] .................................................. H02M 7/5387
[52] U.S. Cl. ............................................. 363/98; 363/132
[58] Field of Search ................................. 363/95, 98, 132

[56] References Cited

U.S. PATENT DOCUMENTS

| | | | |
|---|---|---|---|
| 2,953,737 | 9/1960 | Beach et al. ............................. | 363/132 |
| 3,263,122 | 7/1966 | Genvit ..................................... | 363/132 |
| 4,316,243 | 2/1982 | Archer .................................... | 363/132 |
| 4,564,895 | 1/1986 | Glennon .................................. | 363/132 |
| 4,651,267 | 3/1987 | Nguyen et al. .......................... | 363/132 |
| 4,800,476 | 1/1989 | Harada et al. ........................... | 363/132 |
| 4,969,081 | 11/1990 | Shekhawat et al. .................... | 363/132 |
| 4,994,955 | 2/1991 | Schoofs et al. .......................... | 363/98 |
| 5,047,914 | 9/1991 | Dhyanchand et al. .................. | 363/98 |
| 5,103,390 | 4/1992 | Liu ........................................... | 363/98 |
| 5,717,585 | 2/1998 | Nguyen et al. .......................... | 363/98 |

FOREIGN PATENT DOCUMENTS

| | | | |
|---|---|---|---|
| 63-117657 | 5/1988 | Japan .............................. | M02M 1/08 |
| 1127392 | 8/1989 | Japan .......................... | H02M 7/5387 |

*Primary Examiner*—Jeffrey Sterrett
*Attorney, Agent, or Firm*—Sughrue, Mion, Zinn, Macpeak & Seas, PLLC

[57] ABSTRACT

A power converting apparatus is obtained in which an integrated circuit for driving a power switching element is operated under stable conditions. A core 100 functioning as a common mode transformer made of a material such as ferrite is connected to a wiring line connected between a switch 7, a switch 8, and an IC 13 for opening/closing these switches 7 and 8 in a complementary manner, so that an impedance of a current path to the switch 7 and the IC 13 is increased.

13 Claims, 36 Drawing Sheets

POWER CONVERTING APPARATUS WITH DRIVE SIGNAL PATH IMPEDANCE INCREASING CIRCUITRY

TECHNICAL FIELD

The present invention is related to a power switching element and also to a power converting apparatus including a control IC for controlling this power switching element.

TECHNICAL BACKGROUND

FIG. 24 represents a connection between a power switching element for constructing a conventional power converting apparatus, and a control IC for driving/controlling this power switching element. In this drawing, reference numerals 1 to 4 show DC power supplies, reference numeral 5 indicates a resistor, reference numeral 6 represents a reactor, reference numerals 7 and 8 show switches, reference numerals 9 and 10 denote diodes, reference numeral 11 and 12 show resistors, and reference numeral 13 denotes an IC for driving the above-described switches 7 and 8.

The above-explained power supplies 1 and 2 are such power supplies for supplying energy to a load constituted by the above-described resistor 5 and the above-explained reactor 6. The power supply 3 is such a power supply for supplying electric power between a VB-terminal and a VS-terminal, corresponding to power supply terminals of the IC 13 for driving the switch 7. The DC power supply 4 is such a power supply for supplying electric power between a VCC-terminal and a COM-terminal of the IC 13 for driving the switch 8. The above-explained resistors 11 and 12 are drive resistors for driving the switches 7 and 8.

A signal HIN and a signal LIN, corresponding to the respective switches 7 and 8, are inputted to the IC 13. When the above signal HIN is "high", an output HO of the IC 13 becomes "high". When the above signal HIN is "low", an output LO of the IC 13 becomes "low". Similarly, when the above signal LIN is "high", an output LO of the IC 13 becomes "high". When the above signal LIN is "low", an output LO of the IC 13 becomes "low".

Also, in FIG. 24, it is now that a voltage applied to a load constructed of the resistor 5 and the resistor 6 is "VL"; a current flowing through the load is "IL"; a voltage applied between the VS terminal and the COM terminal in the IC 13 is "Vrev"; a current flowing through a wiring line used to connect an emitter of the switch 8 and the COM terminal of the IC 13 is "Irev"; and voltages of the DC power supply 1 and of the DC power supply 2 are "E". It should be noted that plus polarities of the respective voltages and the respective currents are directed, as viewed in FIG. 24.

Next, a description will now be made of a power supplying method to the load with reference to FIG. 24 and FIG. 25. At this time, it is assumed that the above-described load current IL is directed to a plus direction. In FIG. 25, (a) shows an operation of the switch 7; (b) indicates an operation of the switch 8; (c) represents a waveform of the load voltage VL; (d) shows a waveform of the load current IL; (e) represents a waveform of a current flowing through the switch 7; and (f) indicates a waveform of a current flowing through the diode 10.

In the drawings, when the switch 7 is turned OFF and the switch 8 is turned ON, the load voltage becomes "−E", and then the magnitude of the load current IL is decreased. In this case, the above-described load current IL actually does not flow through the switch 8, but flows through the diode 10. Next, when the switch 7 is turned ON and the switch 8 is turned OFF, the load voltage becomes +E. The magnitude of the load current IL is increased. At this time, the load current IL flows through the switch 7. In other words, when the ON/OFF controls of the switches 7 and 8 are carried out, the load voltage VL can be controlled, and therefore the above-explained load current IL can be controlled.

Also, FIG. 26 shows an internal circuit of the above-described IC 13. In this drawing, reference number 21 shows a rising edge detecting circuit for detecting a rising edge of the above-described signal HIN, reference numeral 22 indicates a falling edge detecting circuit for detecting a falling edge of the signal HIN, and reference numeral 23 represents an MOSFET which is turned ON when an output of the rising edge detecting circuit 21 is high, and which is turned OFF when the output of the falling edge detecting circuit 21 is low. Reference numeral 24 represents a MOSFET which is turned ON when an output of the rising edge detecting circuit 22 is high, and which is turned OFF when the output of the falling edge detecting circuit 21 is low. Reference numerals 25 and 26 are parasitic diodes of the above-described MOSFET 23 and MOSFET 24, reference numerals 27 and 28 show resistors, reference numerals 29 and 30 indicate zener diodes, reference numeral 31 denotes a flip-flop, and reference numerals 32 and 33 are buffer amplifiers for outputting the above-described signals HO and LO. The zener diodes 29 and 30 are connected so as to protect overvoltage on the input side of the flip-flop 31.

Next, operations of the above-explained IC 13 will now be explained with reference to FIG. 27. In FIG. 27, (a) shows a waveform of the above-explained signal HIN; (b) indicates a waveform of the above-described signal LIN; (c) represents an output waveform of the rising edge detecting circuit 21; (d) shows an output waveform of the falling edge detecting circuit 22; (e) indicates an S-input waveform of the flip-flop 31; (f) represents an R-input waveform of the flip-flop 31; (g) shows a waveform of the output Q of the flip-flop 31; (h) denotes a waveform of the signal HO; and (i) denotes a waveform of the signal LO. The signal LIN is directly outputted via the buffer amplifier 33 as the above-explained signal LO.

First, a description will now be made of a time instant "t1" when the above-explained signal HIN is transferred from "low" to "high". At this time, the output waveform of the rising edge detecting circuit 21 becomes high during a predetermined time period, so that the MOSFET 23 is turned ON.

As a result, since the current flows through the resistor 27, a voltage drop occurs at the resistor 27, and the S-input of the flip-flop 31 becomes "low". Then, the flip-flop 31 is set, so that the signal Q becomes "high".

Next, a description will now be made of a time instant "t2" when the above-explained signal HIN is transferred from "high" to "low". At this time, the output waveform of the rising edge detecting circuit 22 becomes high during a predetermined time period, so that the MOSFET 24 is turned ON.

As a result, since the current flows through the resistor 28, a voltage drop occurs at the resistor 28, and the R-input of the flip-flop 31 becomes "low". Then, the flip-flop 31 is reset, so that the signal Q becomes "low".

Since the signal Q is directly outputted via the buffer amplifier 32 as the signal HO, both the above-described signal HIN and signal HO are made substantially coincident with each other.

The above-explained conventional power converting apparatus has such a merit that since the circuit becomes non-insulating conditions from the signal HIN up to the signal HO and from the signal LIN up to the signal LO, the signal transfer delay is small, as compared with the signal transfer via the electric insulation by the photocoupler and the like, and therefore the signal can be more accurately transferred.

Next, with reference to FIG. 28 to FIG. 30, a description will now be made of operations when the above-described load current IL is commutated from the switch 7 to the diode 10. In FIG. 28, it is now assumed that a current flowing through the switch 7 is "IL1". In FIG. 29, reference numerals 40 to 42 indicate wiring line inductance. It is also assumed that a current flowing through the diode 10 is "IL2". Also, in FIG. 30, (a) shows a waveform of the above-described current IL1; (b) represents a waveform of the above-explained current IL2; and (c) represents a waveform of the above-explained voltage Vrev. In a time period shown in FIG. 30, the above-explained current IL is substantially constant. As indicated in FIG. 28, firstly, the switch 7 is turned ON and the switch 8 is turned OFF. Thus, it is assumed that the above-described load current IL flows via the switch 7.

Next, at the time instant t1, if an OFF-instruction is given to the switch 7 and an ON-instruction is given to the switch 8, then the current IL1 is gradually reduced, as indicated in FIG. 30. At a time instant t2, this current IL1 becomes zero. Also, the current IL2 is gradually increased, and then becomes IL at the time instant t2. At this time, IL=IL1+IL2 can be established.

During the above-described commutation operation, a voltage is produced in direct proportional to an inclination of a current directed, as view in the drawing, in the above-described wiring inductance 40 to 42. At the same time, a drop voltage along a forward direction is produced in the diode 10. A summation of these voltages appears as the above-described voltage Vrev. A waveform of this voltage Vref is schematically shown in FIG. 30(c).

Also, in FIG. 31, to achieve a withstanding voltage in the IC 13, the above-described terminal VB is separated from the above-explained terminal COM by a PN junction. In other words, a parasitic diode 50 is present. As a consequence, when the voltage Vrev becomes negative and the magnitude of this voltage exceeds the voltage V3 of the DC power supply 3, the above-explained parasitic diode 50 is turned ON. A current flows through the COM terminal—the parasitic diode 50—the VB terminal—the DC power supply 3, and the wiring line impedance of the path. When the magnitude of the voltage Vrev is lower than the voltage V3 of the DC power supply 3, a reverse current flows through the parasitic diode 50, and thereafter this parasitic diode 50 is turned OFF. At this stage, waveforms are schematically indicated in FIG. 32. FIG. 32(a) shows the voltage Vrev, and FIG. 32(b) represents the current Irev. As a consequence, a current as indicated in FIG. 32(b) will flow inside the IC 13.

Also, the buffer amplifier 32 is arranged as shown in FIG. 33. In other words, reference numeral 52 shows a p type MOSFET, and reference numeral 53 indicates an n type MOSFET. Two MOSFETs 52 and 53 constitute a so-called "CMOS structure".

When the above-explained CMOS structure is rewritten into a semiconductor structural diagram, such a semiconductor structural diagram is made as shown in FIG. 34. Assuming now that an n-type substrate is used as a substrate, a p well is employed while an n type MOSFET is fabricated. In this structure, a transistor 62 and another transistor 63 are parasitically present. Also, a resistor 60 and another resistor 61 are parasitically present on the substrate.

It is now assumed that a current may flow from the VB terminal into the n-type substrate. At this time, at the resistor 60, a voltage drop appears along a direction of "+" and "−", as indicated in this drawing, so that the above-explained transistor 62 is turned ON. As a result, a current flows from the VB-terminal via the resistor 61 to the VS-terminal, so that a voltage drop appears at the resistor 61 along a direction of "+" and "−", as shown in this drawing, and then the transistor 63 is turned ON. As a consequence, since both the VB-terminal and the VS-terminal shortcircuit the DC power supply 3 via the two turned-ON transistors, not only the erroneous operation of the CMOS structure occurs, but also this CMOS structure is thermally destroyed by the overcurrent. That is, a latch-up phenomenon happens to occur.

When the above-described current Irev is sufficiently large, this may cause the above-mentioned latch-up phenomenon. There is a problem that the IC 13 is erroneously operated, or is electrically destroyed.

Also, when the magnitude of the IC 13 is higher than the voltage V3 of the DC power supply 3, the above-described current Irev may flow through the COM-terminal—diode 25—the zener diode 29—the VB-terminal—the DC power supply 3, and the wiring line impedance of the signal path.

Referring now to FIG. 35, operations when the above current may flow will be explained. In FIG. 35, (a) shows a waveform of the current Irev; (b) indicates a waveform of a current flowing through the diode 25; (c) represents a waveform of a current flowing through the diode 29; and (d) shows a waveform of an S-input of the flip-flop 31.

When the voltage Vrev is lower than the voltage VB of the DC power supply 3 at the time instant t1, since the diode 25 and the zener diode 29 are turned OFF, the circuit operation is entered into the reverse recovery operation, so that minus currents will flow through the respective diodes, as represented in this drawing. At this time, as to the electric charge amount for the reverse recovery, if the change amount of the diode 25 is larger than that of the zener diode 29, as shown in this drawing, the zener diode 29 accomplishes the reverse recovery operation at the time instant t2, and then is turned OFF. Since the diode 25 is still under reverse recovery operation, the minus current continuously flows. Thereafter, at a time instant t3, the reverse recovery operation of the diode 25 is completed and this diode 25 is turned OFF.

At this time, the minus current flowing through the diode 25 will flow through the resistor 27. As a consequence, the S-input waveform of the flip-flop 31 becomes low, as shown in the drawing. Therefore, there is a problem that the output signal of the flip-flop 31 is transferred from a "low" state to a "high" state, and this flip-flop 31 is erroneously ignited.

In other words, as shown in FIG. 36, the above-described current Irev may cause a problem, which flows when the high voltage Vrev is produced along the minus direction.

To solve this problem, as indicated in FIG. 37, in the conventional power converting apparatus, the resistor 70 is connected to the resistor 71, and it is so set: the value of resistor 11=the value of resistor 70+the value of resistor 71 in order to increase the impedance of the signal path through which the current Irev flows. As a result, since the above-described current Irev can be suppressed, it is possible to suppress the erroneous operation and the electric destruction of the IC 13.

Also, in another conventional power converting apparatus, as indicated in FIG. 38, since the diode 72 is connected between the COM terminal and the VS terminal of the IC 13, the current Irev is bypassed by the diode 72, so that the current flowing through the IC 13 can be suppressed. Thus, it is possible to suppress the erroneous operation and the electric destruction of the IC 13.

However, generally speaking, in FIG. 37, in such a case that the switch 7 is selected as a switch element having a large capacity, since the drive resistance value for driving the switch 7 is set to a small resistance value, the resistance value of the resistor 71 must be set to a small value. Thus, there is a problem that such an impedance capable of suppressing the above-described current Irev cannot be obtained.

Also, in FIG. 38, since the current Irev is shunted based upon a ratio of the impedance of the signal path passing through the diode 72 to the impedance of the signal path passing through the IC 13, there are some cases that the current flowing through the IC 13 cannot be completely suppressed, depending upon the characteristic and the connecting way of the diode 72. Also, since the anode and the cathode of the above-described diode 72 are connected to the emitter of the switch 8 and the emitter of the switch 7, when the voltages of the above-described DC power supply 1 and DC power supply 2 are high, the withstanding voltage of the diode 72 must be selected to be a high withstanding voltage in connection with these high voltages. As a consequence, there is another problem that the reliability is deteriorated, and the cost is increased.

DISCLOSURE OF THE INVENTION

A power converting apparatus, according to the present invention, is comprised of: an electric valve group containing a first electric valve and a second electric valve, which have first terminals, second terminals, and third terminals, and in which the first terminals and the third terminals are opened/closed by supplying an electric signal between the second terminals and the third terminals, and also the first electric valve is series-connected to the second electric valve; a power supply group containing a first power supply and a second power supply series-connected to the first power supply, the power supply group being connected in parallel to the electric valve group; a load connected between a junction point defined by the first electric valve and the second electric valve, and another junction point defined by the first power supply and the second power supply; control means connected to the second terminals in the first and second electric valves and also to the third terminals in the first and second electric valves, for opening/closing the first and second electric valves in a complementary manner; a third power supply, one end of which is connected to the control means, and the other end of which is connected to the third terminal in the first electric valve; a fourth power supply, one end of which is connected to the control means, and the other end of which is connected to the third terminal in the second valve; and impedance increasing means for increasing an impedance of a signal path defined from the third terminal in the second electric valve via the control means and the third power supply to the third terminal in the electric valve.

Also, the impedance increasing means is a transformer.

Furthermore, the transformer is hollow; and a line used to connect the second terminal in the second electric valve with the control means and another line used to connect the third terminal in the second electric valve with the control means are provided in such a manner that both the lines penetrate the hollow of the transformer.

Moreover, the transformer is hollow; and a line used to connect the second terminal in the first electric valve with the control means and another line used to connect the third terminal in the first electric valve with the control means are provided in such a manner that both the lines penetrate the hollow of the transformer.

Also, the line used to connect the second terminal in the second electric valve with the control means and the line used to connect the third terminal in the second electric valve with the control means are provided in such a manner that both the lines penetrate the hollow of the transformer plural times.

Further, the line used to connect the second terminal in the first electric valve with the control means and the line used to connect the third terminal in the first electric valve with the control means are provided in such a manner that both the lines penetrate the hollow of the transformer plural times.

Moreover, the transformer is hollow; and a line used to connect the second terminal in the first electric valve with the control means, another line used to connect the third terminal in the first electric valve with the control means, another line used to connect the second terminal in the second electric valve with the control means, and another line used to connect the third terminal in the second electric valve with the control means are provided in such a manner that the lines penetrate the hollow of the transformer.

Also, the impedance increasing means is a resistor.

Furthermore, the third power supply is connected via the resistor to the control means.

Moreover, the power converting apparatus is comprised of a diode connected in parallel to the resistor.

Also, the impedance increasing means includes: a diode series-connected between the control means and the third power supply; a capacitor connected in parallel to the diode and the third power supply; and a resistor series-connected to the capacitor and also connected in parallel to both the diode and the third power supply.

A power converting apparatus, according to the present invention, is comprised of: a first electric valve provided so as to supply power from a first power supply to a load; a second electric valve provided so as to supply power from a second power supply to the load; control means for controlling a switching operation of conducting the first electric valve and the second electric valve in a complementary manner by supplying a switching control signal to a control electrode of the first electric valve and also to a control electrode of the second electric valve; a third power supply connected between one of main electrodes of the first electric valve and the control means; a fourth power supply connected between one of main electrodes of the second electric valve and the control means; and impedance increasing means provided in a series circuit constituted by a main electrode of the second electric valve, the control means, the third power supply, and a main electrode of the first electric valve, for increasing an impedance of the series circuit.

BEST MODE FOR CARRYING OUT THE INVENTION

Now, a description will be made of embodiments according to the present invention.

EMBODIMENT 1

Figure 1:
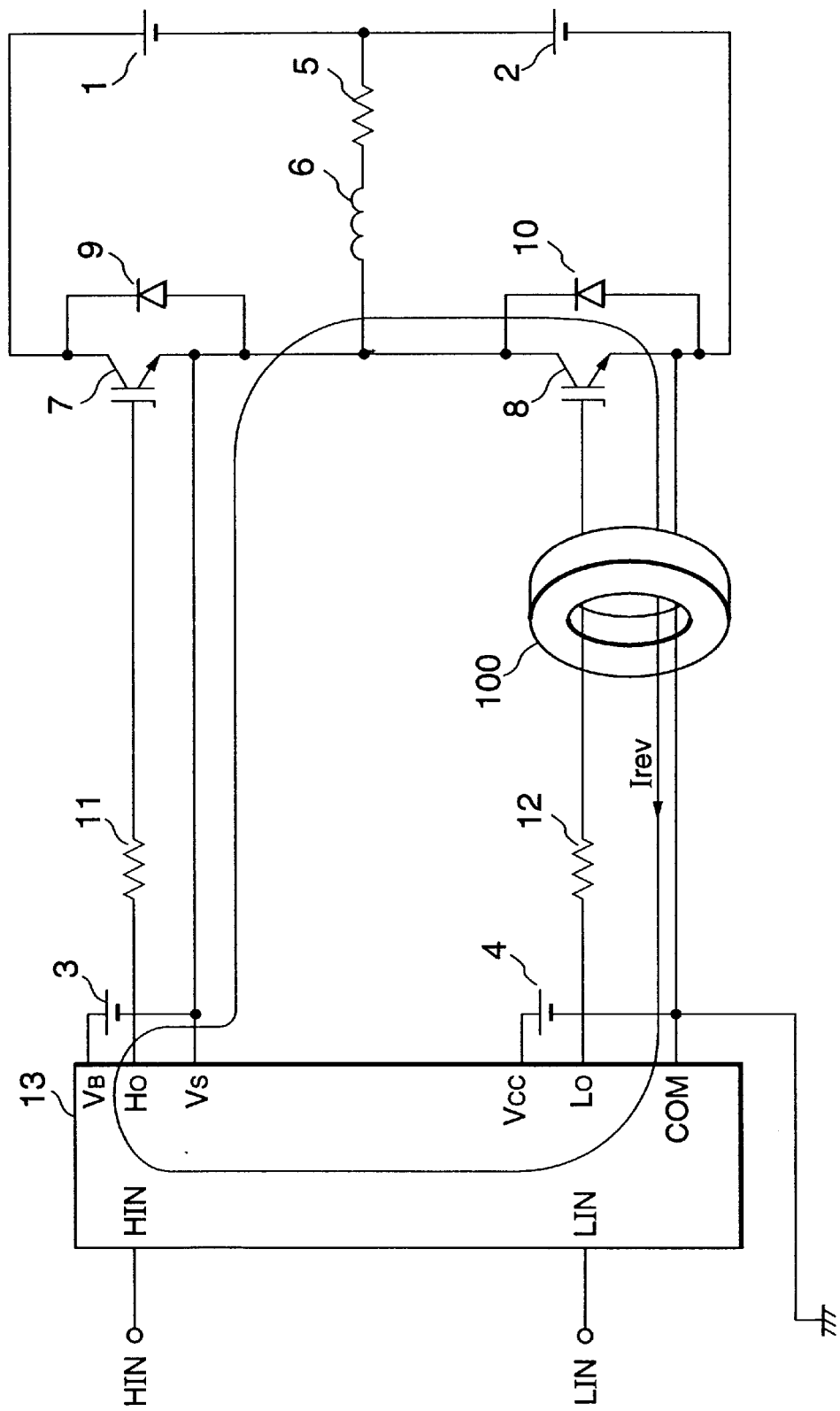
FIG. 1 is a circuit diagram for indicating a power converting apparatus according to an embodiment 1.

FIG. 1 indicates a power converting apparatus according to an embodiment of the present invention. In this drawing, reference numerals 1 to 13 indicate the same circuit elements of the above-explained conventional power converting apparatus, and explanations thereof are omitted. Reference numeral 100 indicates a core (common mode transformer) made of a material of, for example, ferrite and the like.

In the power converting apparatus with the above-described circuit arrangement, since the current Irev penetrates the core 100 by 1 time, the core 100 many function as an inductance component with respect to the current Irev. In other words, the impedance of the signal path of the above-explained Irev is increased.

When the impedance of the signal path of the current Irev is increased, this current Irev can be suppressed. As a result, it is possible to prevent the IC 13 from the erroneous operation and the electric destruction.

A current flowing through a current path used to drive the switch 8, namely a current flowing from the LO-terminal of the IC 13 via the resistor 12, the gate of the switch 8, and the emitter of the switch 8 to the COM terminal of the IC 13 penetrates the core 100 by 1 time along different directions to each other. The magnetic fluxes produced within the core 100 are canceled with each other, so that the core 100 does not function as an inductance component. In other words, the delay in the drive speed of the switch 8 caused by connecting the above-explained core 100 is not produced, but also the erroneous operation of the IC 13 and also the electric destruction thereof can be prevented.

Originally, since the above-described current Irev flows through the IC 13, and the current value is low, a low-cost core can be used as the core 100.

Figure 2:
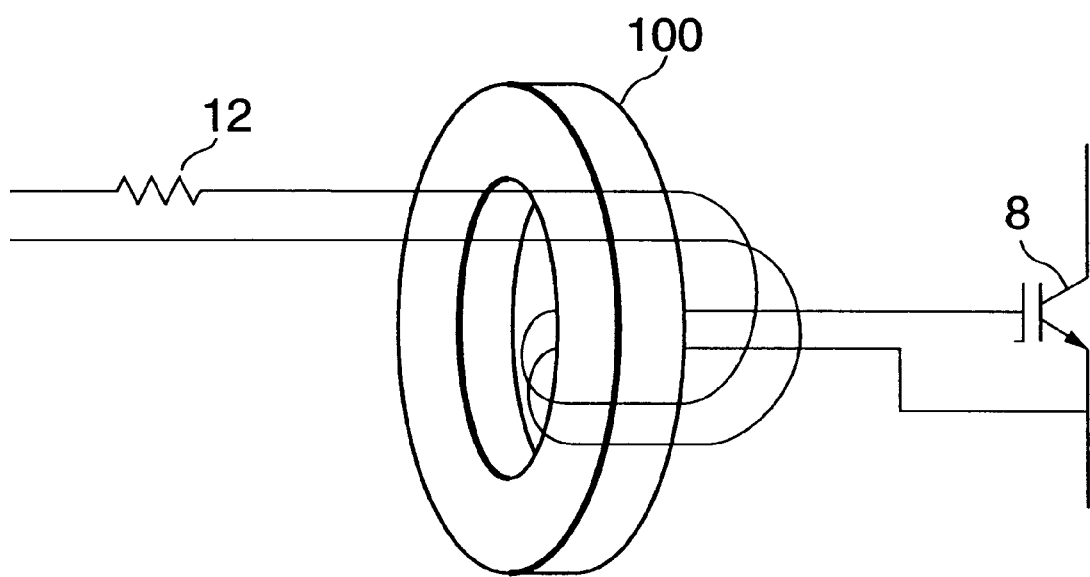
FIG. 2 is a diagram for showing such a case that a connection line is wound on a core by two turns.

Also, as indicated in FIG. 2, when the power converting apparatus is arranged in such a manner that the above-described current Irev penetrates the core 100 two times, since an impedance component with respect to the signal path through which the above-explained current Irev flows is increased, the current Irev can be furthermore suppressed, and the erroneous operation of the IC 13 and the electric destruction thereof can be prevented.

It should be noted that in FIG. 2, the current Irev penetrates the core 100 two times. In general, it may be so arranged that the above-described current Irev may pass through the core 100 plural times.

In FIG. 1 and FIG. 2, the power converting apparatuses are arranged by employing only one core. Alternatively, it is apparently possible to arrange the power converting apparatus by employing a plurality of cores.

Also, in the drawing, apparently it may be arranged that the drive signal path (namely, terminal HO—resistor 11—switch 7—terminal VS) via the resistor 11 is connected under twist line condition for suppressing induction noise.

Also, since the magnetic flux produced in the common mode transformer is small, a low-cost common mode transformer may be used as the above-described common mode transformer.

Also, it is possible to prevent the erroneous operation of the IC and the electric destruction thereof without giving an adverse influence to the switching speed of the electric valve.

It should also be noted that this embodiment has described such a circuit that the power supply 1 and the power supply 2 are separately provided. Alternatively, this circuit may be arranged by employing a common power supply capable of commonly using these power supplies. Even in this case, the common power supply functionally includes the power supply 1 and the power supply 2. This point is similarly applied to the subsequent embodiments.

It should be understood in this specification that the emitters and the collectors of the switches 7 and 8 will also be referred to as "main electrodes", and the bases of these switches 7 and 8 will also be referred to as "control electrodes".

In this embodiment, as the load, the resistor 5 is series-connected to the reactor 6. Alternatively, any one of the resistor 5 and the reactor 6 may be employed.

EMBODIMENT 2

Figure 3:
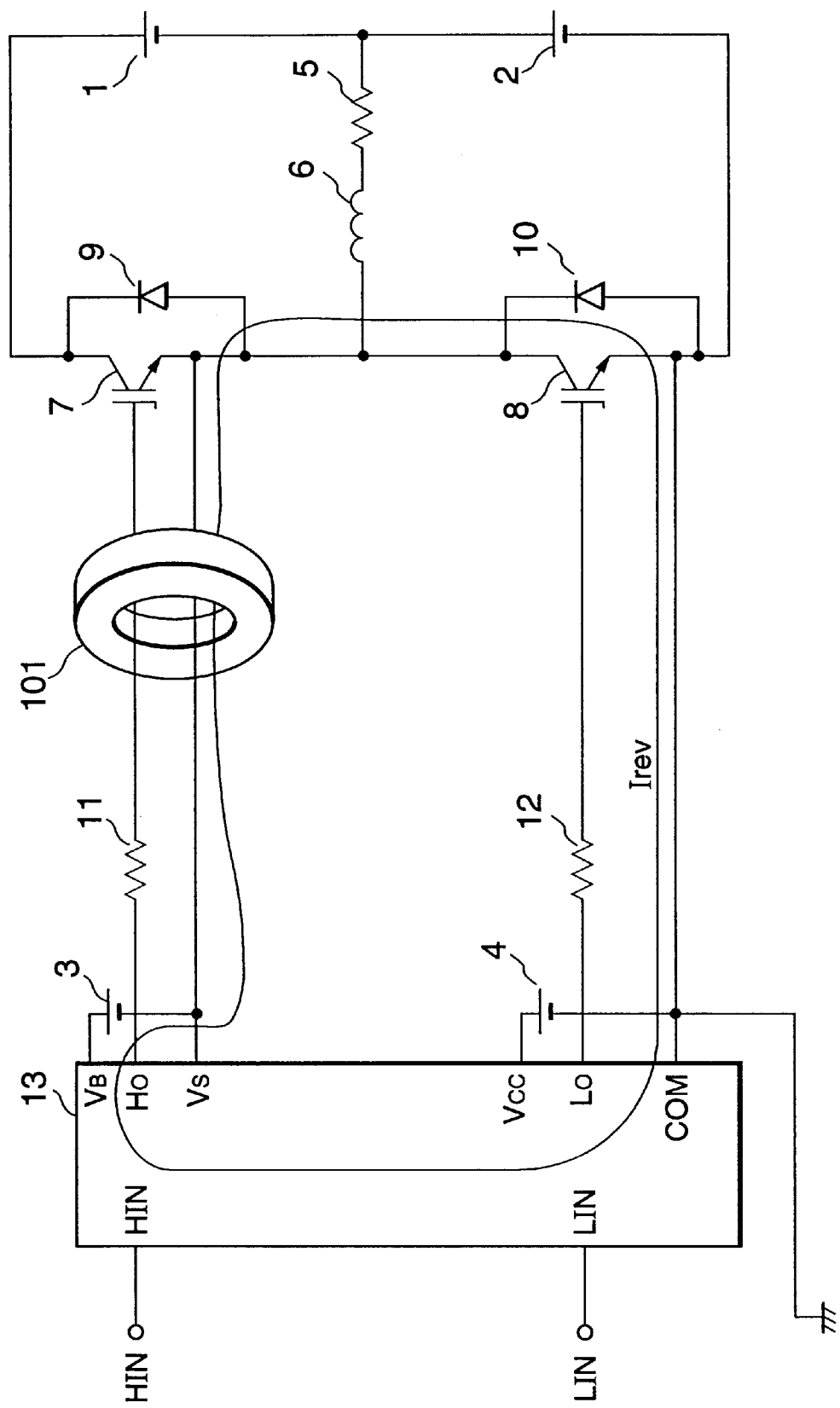
FIG. 3 is a circuit diagram for indicating a power converting apparatus according to an embodiment 2.

FIG. 3 indicates a power converting apparatus according to a second embodiment of the present invention. In this drawing, reference numerals 1 to 13 indicate the same circuit elements of the above-explained conventional power converting apparatus, and explanations thereof are omitted. Reference numeral 101 indicates a core (common mode transformer) made of a material of, for example, ferrite and the like.

In the power converting apparatus with the above-described circuit arrangement, since the current Irev penetrates the core 101 by 1 time, the core 101 may function as an inductance component with respect to the current Irev. In other words, the impedance of the signal path of the above-explained Irev is increased.

When the impedance of the signal path of the current Irev is increased, this current Irev can be suppressed. As a result, it is possible to prevent the IC 13 from the erroneous operation and the electric destruction.

A current flowing through a current path used to drive the switch 7, namely a current flowing from the HO-terminal of the IC 13 via the resistor 11, the gate of the switch 7, and the emitter of the switch 7 to the VS terminal of the IC 13 penetrates the core 101 by 1 time along different directions to each other. The magnetic fluxes produced within the core 101 are canceled with each other, so that the core 101 does not function as an inductance component. In other words, the delay in the drive speed of the switch 7 caused by connecting the above-explained core 101 is not produced, but also the erroneous operation of the IC 13 and also the electric destruction thereof can be prevented.

Originally, since the above-described current Irev flows through the IC 13, and the current value is low, a low-cost core can be used as the core 101.

Also, the power converting apparatus is arranged in such a manner that the above-described current Irev may penetrate the core 101 by plural times.

Alternatively, it is apparently possible to arrange the power converting apparatus by employing a plurality of cores.

Also, in the drawing, apparently it may be arranged that the drive signal path (namely, terminal HO—resistor 11—switch 7—terminal VS) via the resistor 11 is connected under twist line condition for suppressing induction noise. Also, similarly, the drive signal path (namely, terminal LO—resistor 12—switch 8—terminal COM) via the resistor 12 may be connected under twist line condition for suppressing induction noise.

EMBODIMENT 3

Figure 4:
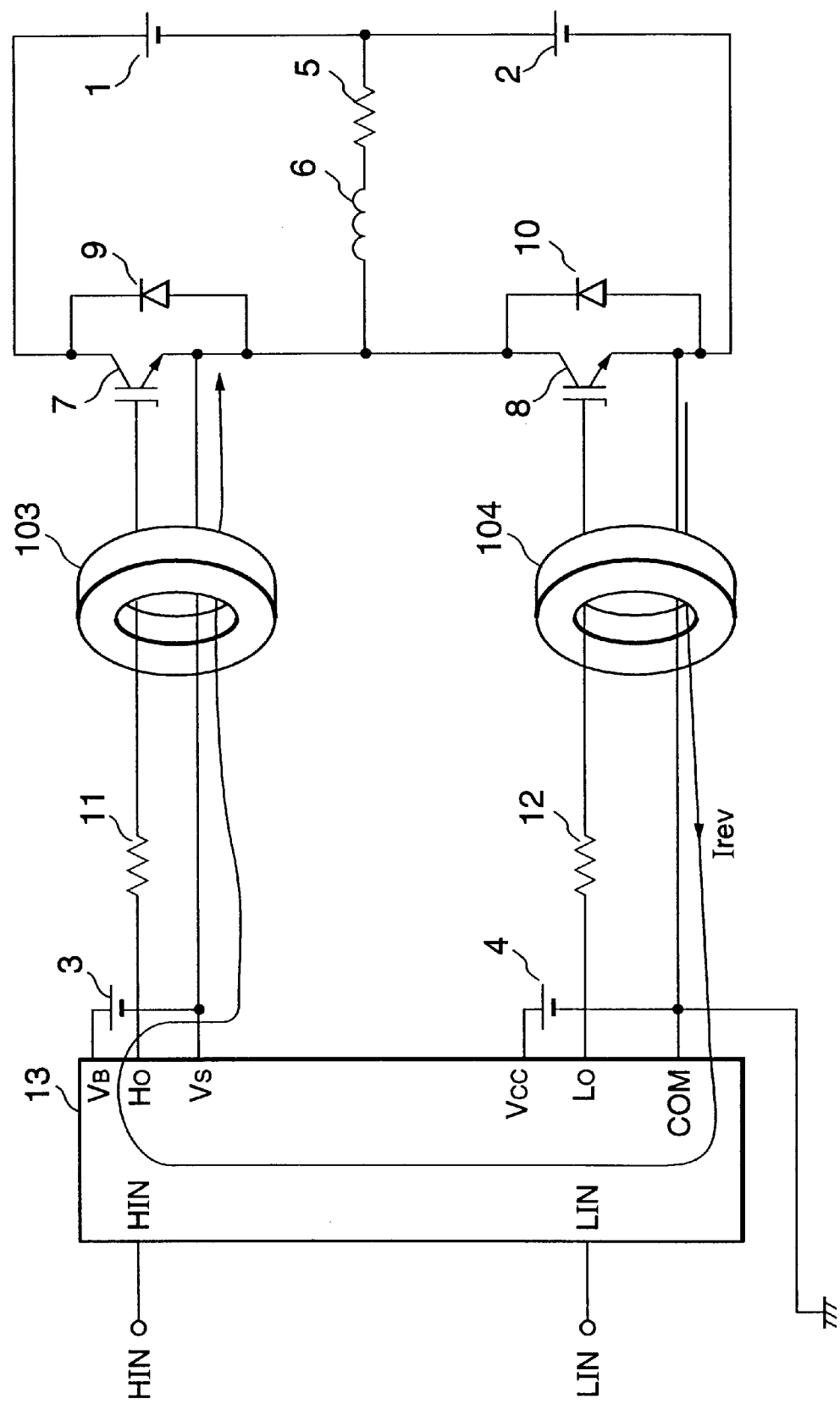
FIG. 4 is a circuit diagram for indicating a power converting apparatus according to an embodiment 3.

FIG. 4 indicates a power converting apparatus according to a third embodiment of the present invention. In this drawing, reference numerals 1 to 13 indicate the same circuit elements of the above-explained conventional power converting apparatus, and explanations thereof are omitted. Reference numerals 102 and 104 indicate cores (common mode transformers) made of a material of, for example, ferrite and the like.

In the power converting apparatus with the above-described circuit arrangement, since the current Irev penetrates the core 103 by 1 time and the core 104 by 1 time, the cores 103 and 104 may function as inductance components with respect to the current Irev. In other words, the impedance of the signal path of the above-explained Irev is increased.

When the impedance of the signal path of the current Irev is increased, this current Irev can be suppressed. As a result, it is possible to prevent the IC 13 from the erroneous operation and the electric destruction.

A current flowing through a current path used to drive the switch 8, namely a current flowing from the LO-terminal of the IC 13 via the resistor 12, the gate of the switch 8, and the emitter of the switch 8 to the COM terminal of the IC 13 penetrates the core 104 by 1 time along different directions to each other. The magnetic fluxes produced within the core 104 are canceled with each other, so that the core 104 does not function as an inductance component. In other words, the delay in the drive speed of the switch 8 caused by connecting the above-explained core 104 is not produced, but also the erroneous operation of the IC 13 and also the electric destruction thereof can be prevented.

Also, a current flowing through a current path used to drive the switch 7, namely a current flowing from the HO-terminal of the IC 13 via the resistor 11, the gate of the switch 7, and the emitter of the switch 7 to the VS terminal of the IC 13 penetrates the core 103 by 1 time along different directions to each other. The magnetic fluxes produced within the core 103 are canceled with each other, so that the core 103 does not function as an inductance component. In other words, the delay in the drive speed of the switch 7 caused by connecting the above-explained core 103 is not produced, but also the erroneous operation of the IC 13 and also the electric destruction thereof can be prevented.

Originally, since the above-described current Irev flows through the IC 13, and the current value is low, a low-cost core can be used as the cores 103 and 104.

It should be noted that it may be so arranged that the above-described current Irev may pass through the cores 103 and 104 plural times.

Alternatively, it is apparently possible to arrange the power converting apparatus by employing a plurality of the above-described cores 103 and 104.

Also, in the drawing, apparently it may be arranged that the drive signal path (namely, terminal HO—resistor 11—switch 7—terminal VS) via the resistor 11 is connected under twist line condition for suppressing induction noise. Also, similarly, the drive signal path (namely, terminal LO—resistor 12—switch 8—terminal COM) via the resistor 12 may be connected under twist line condition for suppressing induction noise.

EMBODIMENT 4

Figure 5:
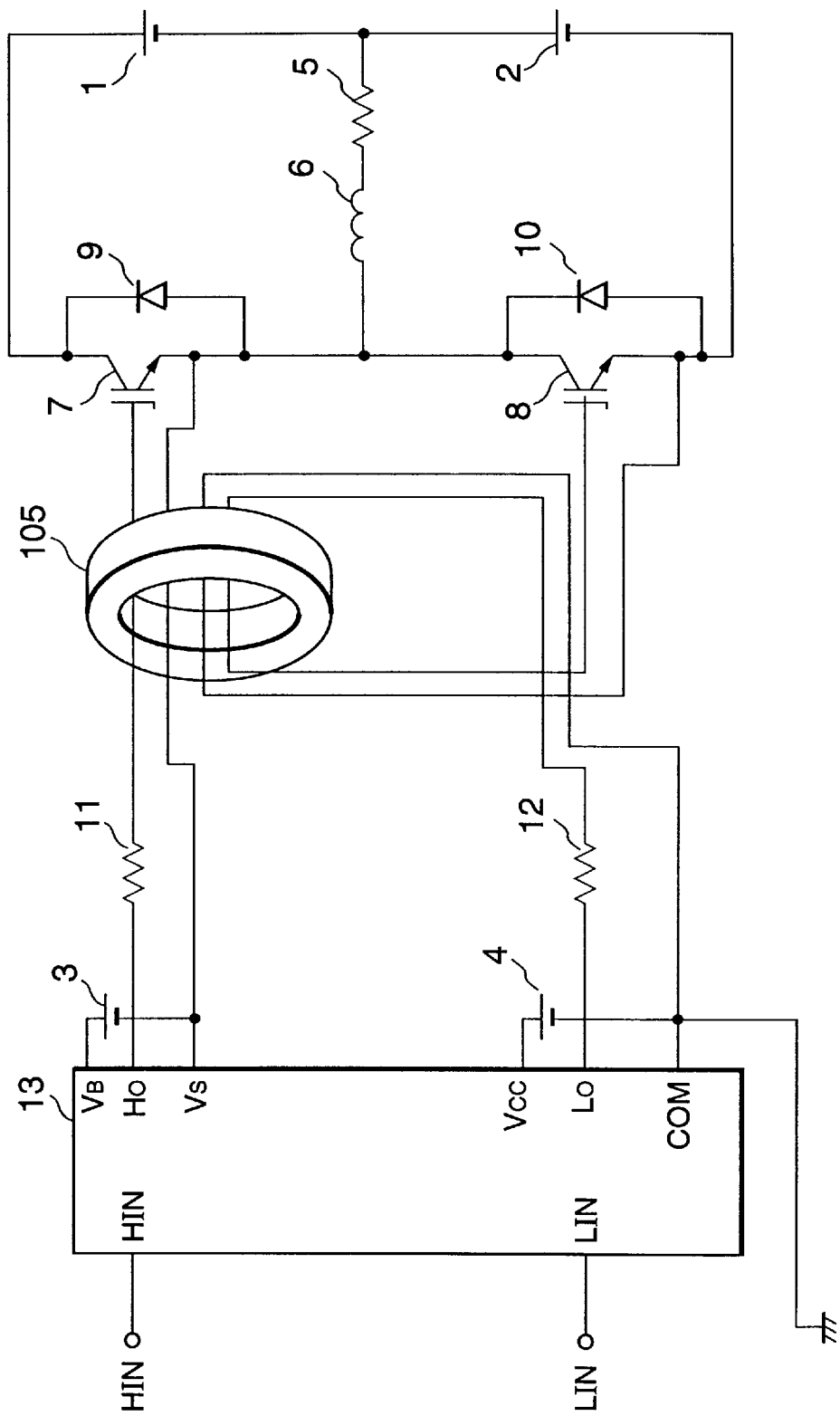
FIG. 5 is a circuit diagram for indicating a power converting apparatus according to an embodiment 4.

FIG. 5 indicates a power converting apparatus according to a fourth embodiment of the present invention. In this drawing, reference numerals 1 to 13 indicate the same circuit elements of the above-explained conventional power converting apparatus, and explanations thereof are omitted. Reference numeral 105 indicates a core (common mode transformer) made of a material of, for example, ferrite and the like.

In the power converting apparatus with the above-described circuit arrangement, since the current Irev penetrates the core 105 by 2 times, the core 105 may function as an inductance component with respect to the current Irev. In other words, the impedance of the signal path of the above-explained Irev is increased.

When the impedance of the signal path of the current Irev is increased, this current Irev can be suppressed. As a result, it is possible to prevent the IC 13 from the erroneous operation and the electric destruction.

A current flowing through a current path used to drive the switch 8, namely a current flowing from the LO-terminal of the IC 13 via the resistor 12, the gate of the switch 8, and the emitter of the switch 8 to the COM terminal of the IC 13 penetrates the core 105 by 1 time along different directions to each other. The magnetic fluxes produced within the core 105 are canceled with each other, so that the core 105 does not function as an inductance component. In other words, the delay in the drive speed of the switch 8 caused by connecting the above-explained core 105 is not produced, but also the erroneous operation of the IC 13 and also the electric destruction thereof can be prevented.

Also, a current flowing through a current path used to drive the switch 7, namely a current flowing from the HO-terminal of the IC 13 via the resistor 11, the gate of the switch 7, and the emitter of the switch 7 to the VS terminal of the IC 13 penetrates the core 105 by 1 time along different directions to each other. The magnetic fluxes produced within the core 105 are canceled with each other, so that the core 105 does not function as an inductance component. In other words, the delay in the drive speed of the switch 7 caused by connecting the above-explained core 100 is not produced, but also the erroneous operation of the IC 13 and also the electric destruction thereof can be prevented.

Originally, since the above-described current Irev flows through the IC 13, and the current value is low, a low-cost core can be used as the core 105.

It should be noted that it may be so arranged that the above-described current Irev may pass through the core 105 more plural times.

Alternatively, it is apparently possible to arrange the power converting apparatus by employing a plurality of cores 105.

Also, under such a condition that only one core is used due to low cost and also, as represented in FIG. 2, the same drive wiring line cannot penetrate such a single core by more than 2 times because of the arrangement of the power converting apparatus, only such an impedance of a single core is merely obtained with respect to the current Irev. To the contrary, according to this embodiment, since the impedance for two sets of cores can be obtained, the current Irev can be furthermore suppressed.

Also, in the drawing, apparently it may be arranged that the drive signal path (namely, terminal HO—resistor 11—switch 7—terminal VS) via the resistor 11 is connected under twist line condition for suppressing induction noise. Also, similarly, the drive signal path (namely, terminal LO—resistor 12—switch 8—terminal COM) via the resistor 12 may be connected under twist line condition for suppressing induction noise.

EMBODIMENT 5

Figure 6:
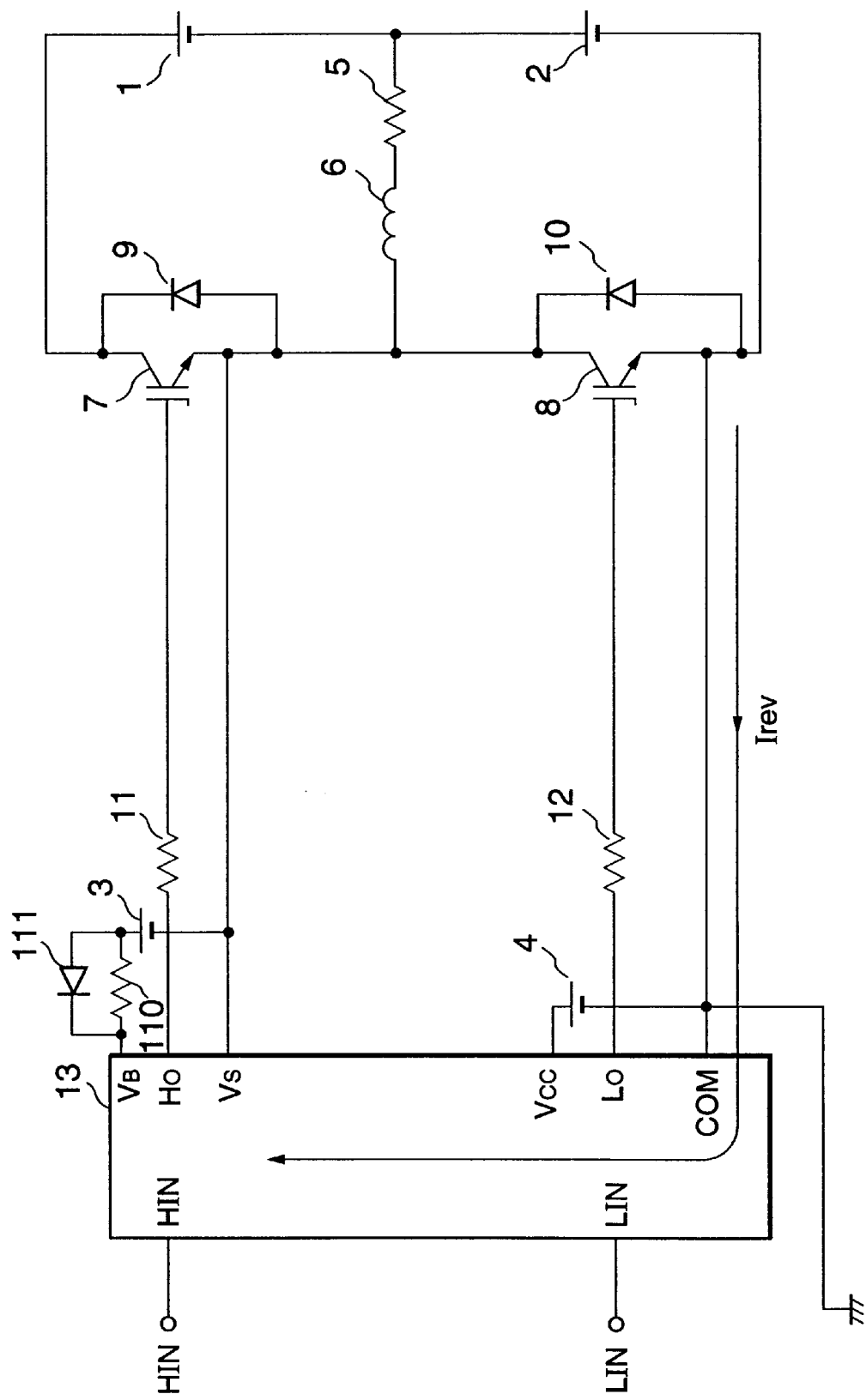
FIG. 6 is a circuit diagram for indicating a power converting apparatus according to an embodiment 5.

FIG. 6 indicates a power converting apparatus according to a fifth embodiment of the present invention. In this drawing, reference numerals 1 to 13 indicate the same circuit elements of the above-explained conventional power converting apparatus, and explanations thereof are omitted. Reference numeral 110 indicates a resistor, and reference numeral 111 shows a diode.

In the power converting apparatus with the above-described circuit arrangement, when the current Irev flows along a direction as shown in the drawing, since the resistor 110 is present, this current Irev can be suppressed. As a result, it is possible to prevent the IC 13 from the erroneous operation and the electric destruction.

Also, in the case that the resistor 110 is provided in the above-described manner, since it becomes high impedance due to the resistor 100, the impedance of this signal path must be lowered so as to supply a drive power supply from the power supply 3 via the diode 111 to VB. To this end, the diode 111 is provided as shown in this drawing.

Also, since an impedance component is not newly added to a current path used to drive the switch 7 under ON state, namely a signal path defined by the power supply 3—the diode 111—the HO terminal of the IC 13—the resistor 11—the gate of the switch 7—the emitter of the switch 7, there is no delay in the drive speed of the switch 7. It is, of course, no problem in such a case that the switch 7 is driven to the OFF state.

Also, since the above-described diode 111 is connected via the power supply 3 to the VB-terminal of the IC 13 and the VS-terminal thereof, such a diode having a low rating voltage may be used, so that a low-cost diode may be employed as the diode 111.

As explained in the above-explained embodiment, when the ferrite core is employed, the mechanism capacity (mechanism volume) is increased and the cost is increased. However, since both the resistor 110 and the diode 111 are used, there is such an advantage that the space saving matter and the low cost aspect can be realized.

Also, in the drawing, apparently it may be arranged that the drive signal path (namely, terminal HO—resistor 11—switch 7—terminal VS) via the resistor 11 is connected under twist line condition for suppressing induction noise. Also, similarly, the drive signal path (namely, terminal LO—resistor 12—switch 8—terminal COM) via the resistor 12 may be connected under twist line condition for suppressing induction noise.

EMBODIMENT 6

In the case that the above-described DC power supply 3 is, for instance, such a DC power supply containing high frequency noise and high frequency ripples such as a switching power supply, there are some possibilities that a decoupling capacitor having a small capacitance and a better high frequency characteristic is connected between the VB-terminal and the VS-terminal, corresponding to the power supply voltage terminals of the IC 13 in order not apply the noise and the ripple component. In this case, the current Irev will flow through the above-described decoupling capacitor, so that the IC 13 is erroneously operated, and is electrically destroyed.

Figure 7:
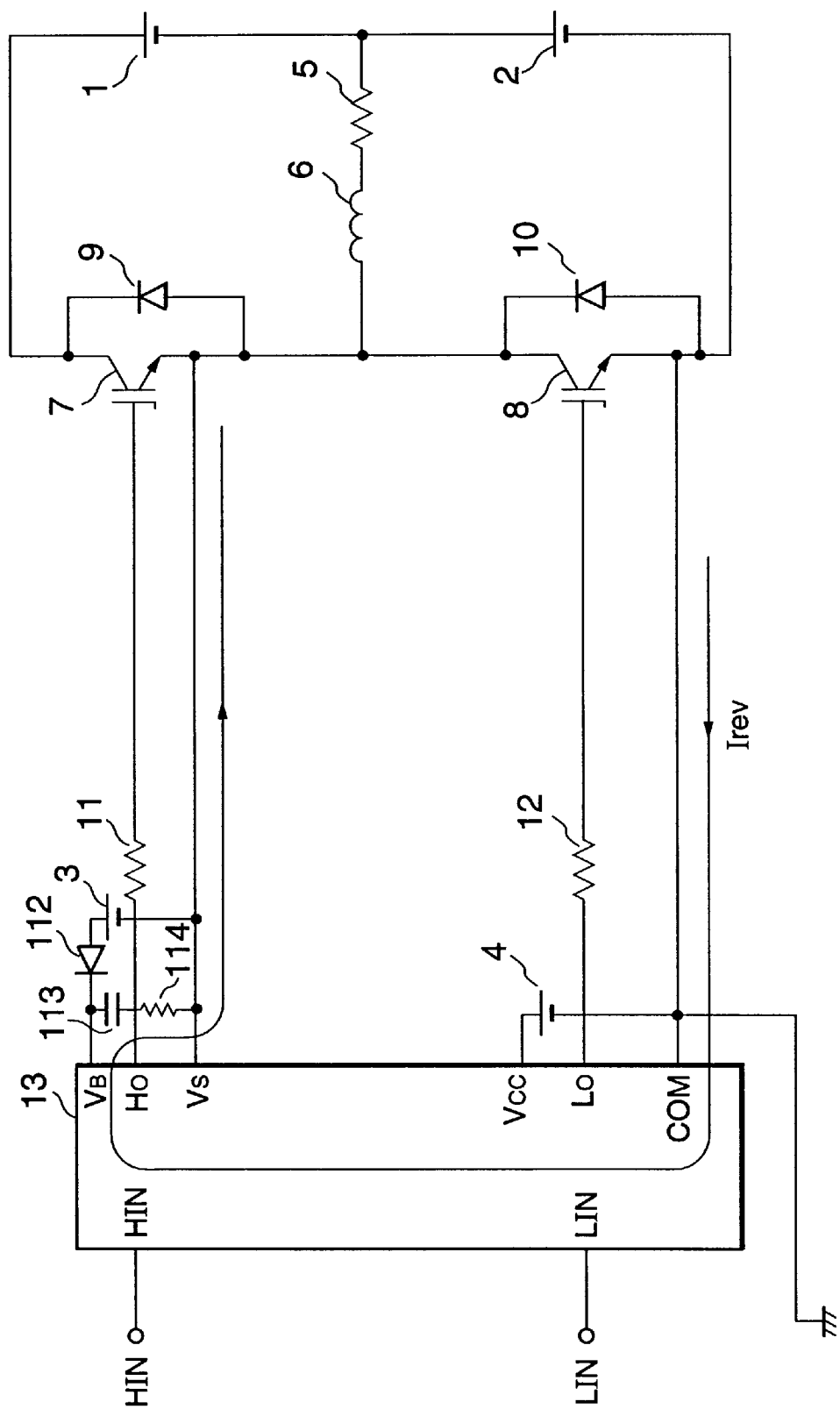
FIG. 7 is a circuit diagram for indicating a power converting apparatus according to an embodiment 6.

FIG. 7 indicates a power converting apparatus according to a sixth embodiment of the present invention. In this drawing, reference numerals 1 to 13 indicate the same circuit elements of the above-explained conventional power converting apparatus, and explanations thereof are omitted. Reference numeral 112 indicates a diode, reference numeral 113 shows a capacitor functioning as a decoupling capacitor, and reference numeral 114 is a resistor.

The above-described current Irev is blocked by the diode 112, and there is no path through which the current passes via the DC power supply 3. As a consequence, the current Irev will flow via the capacitor 113. However, since the resistor 114 is present, the current Irev is suppressed, so that the erroneous operation of the IC 13 and the electric destruction thereof can be avoided. Also, if the resistance value of the resistor 114 may be set to a small value, then the impedance of the high frequency component with respect to the DC power supply 3 is not so increased. As a consequence, the high frequency noise and the high frequency ripple in the DC power supply 3 can be absorbed in the path of the capacitor 113 and the resistor 114.

Also, in the drawing, apparently it may be arranged that the drive signal path (namely, terminal HO—resistor 11—switch 7—terminal VS) via the resistor 11 is connected under twist line condition for suppressing induction noise. Also, similarly, the drive signal path (namely, terminal LO—resistor 12—switch 8—terminal COM) via the resistor 12 may be connected under twist line condition for suppressing induction noise.

In the above-described embodiment, since the impedance is increased by employing the ferrite core, the apparatus capacity (appliance volume) and the apparatus cost are increased. However, in this embodiment, since the impedance is increased by employing the capacitor 113 and the resistor 114, the space saving and the cost saving can be realized.

EMBODIMENT 7

Figure 8:
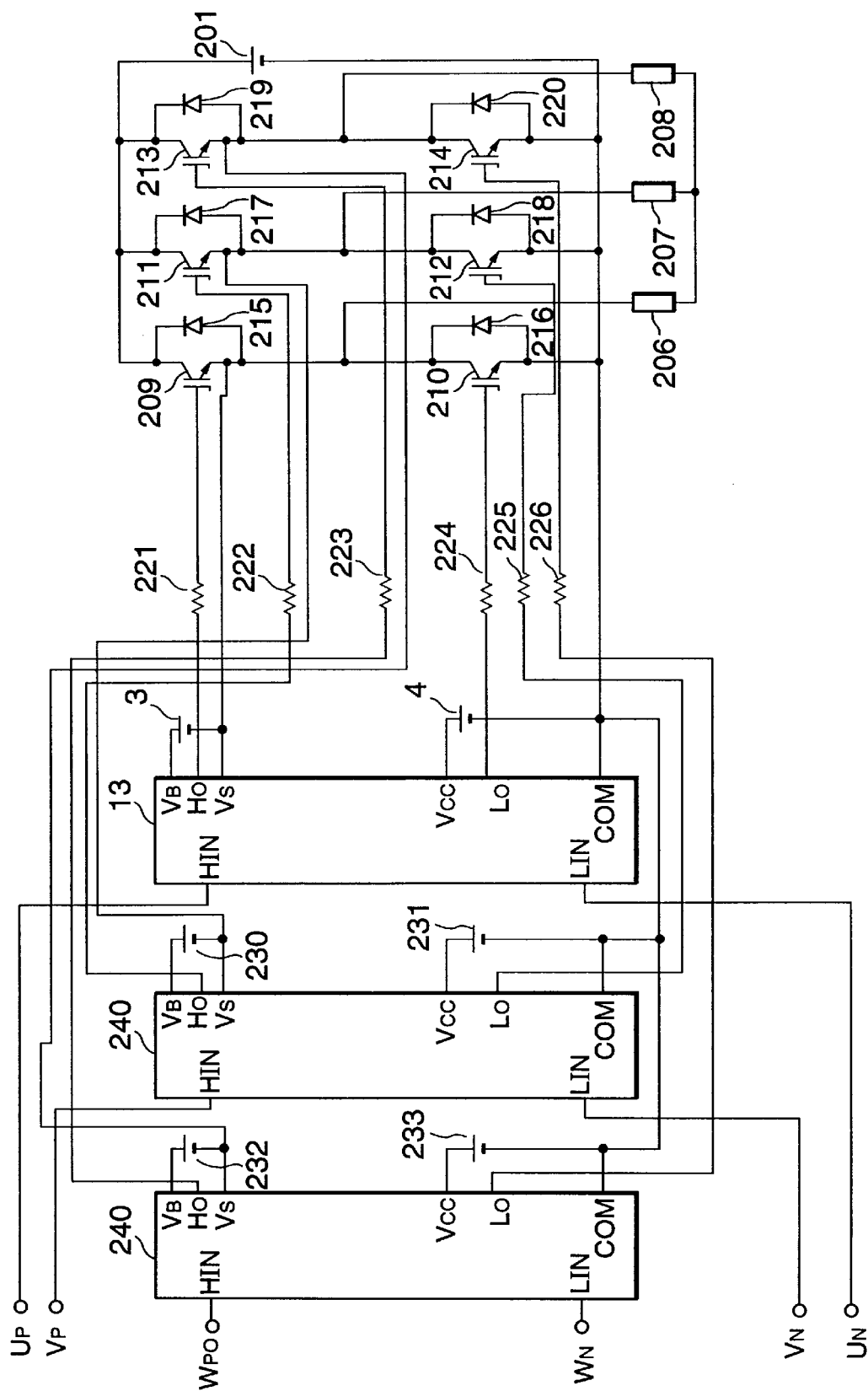
FIG. 8 is a diagram for showing a method for connecting a 3-phase power converting circuit with three ICs.

FIG. 8 represents such a case that a 3-phase power converting circuit is driven by the above-described IC 13. In this drawing, reference numerals 3, 4, and 13 indicate the same circuit elements of the above-described conventional power converting apparatus, and explanations thereof are omitted. Reference numerals 206 to 208 show loads; reference numerals 209 to 214 indicate switches; and reference numerals 215 to 220 represent diodes. A 3-phase power converting circuit is arranged by the above-described switches 209 to 214, and the above-explained diode 215 to 220. Reference numerals 221 to 226 show resistors; reference numerals 230 to 233 indicate DC power supplies; reference numeral 240 indicates an IC for driving the above-explained switches 211 and 212; and reference numeral 241 denotes an IC for driving the above-mentioned switches 213 and 214.

The above-explained DC power supply 201 is such a power supply for supplying energy to the above-described loads 206 to 208. The above-described DC power supply 230 is a power supply for supplying electric power between a VB-terminal and a VS-terminal, equal to power supply voltage supplying terminals of the IC 240 for driving the switch 211, and the above-described DC power supply 231 is a power supply for supplying electric power between a VCC-terminal and a COM-terminal, equal to power supply voltage supplying terminals of the IC 240 for driving the switch 212. The above-described DC power supply 232 is a power supply for supplying electric power between a VB-terminal and a VS-terminal, equal to power supply voltage supplying terminals of the IC 241 for driving the switch 213, and the above-described DC power supply 233 is a power supply for supplying electric power between a VCC-terminal and a COM-terminal, equal to power supply voltage supplying terminals of the IC 241 for driving the switch 214. The above-explained resistor 221 is a drive resistor for driving the above-mentioned switch 209, the above-mentioned resistor 222 is a drive resistor for driving the above-explained switch 211, and the above-described resistor 223 is a drive resistor for driving the above-described resistor 213. Also, the above-explained resistor 224 is a drive resistor for driving the above-mentioned switch 210, the above-mentioned resistor 225 is a drive resistor for driving the above-explained switch 212, and the above-described resistor 226 is a drive resistor for driving the above-described resistor 214.

In the above-described IC 13, a signal UP corresponding to the switch 209 is entered into an HIN-terminal, and another signal UN corresponding to the switch 210 is entered into an LIN terminal. Also, in the above-explained IC 240, a signal VP corresponding to the switch 211 is entered into an HIN terminal, and another signal VN corresponding to the switch 212 is entered into an LIN terminal. Further, in the above-described IC 24, a signal WP corresponding to the switch 213 is entered into an HIN-terminal, and another signal WN corresponding to the switch 214 is entered into an LIN terminal. When the signal UP is high, the output HO of the IC 13 becomes high, whereas the signal LIP is low, the output HO of this IC 13 becomes low. Similar to the above case, when the signal UN is high, the output OL of the IC 13 becomes high, whereas the signal UN is low, the output LO of the IC 13 becomes low. Also, similar to the above case, when the signal VP is high, the output HO of the IC 240 become high, whereas when the signal VP is low, the output HO of the IC 240 becomes low. Similarly, when the signal VN is high, the output LO of the IC 240 becomes high, whereas the signal VN is low, the output LO of this IC 240 becomes low. Similar to the above case, when the signal WP is high, the output HO of the IC 241 becomes high, whereas the signal WP is low, the output HO of the IC 241 become low. Also, similar to the above case, when the signal WN is high, the output LO of the IC 241 becomes high, whereas when the signal WN is low, the output LO of the IC 241 becomes low.

As a consequence, for example, in the case that the output HO of the IC 13 is high and the output LO of the IC 13 is low; the output HO of the IC 240 is low and the output LO of the IC 240 is high; and the output HO of the IC 241 is low and the output LO of to IC 241 is high, a current derived from the power supply 201 will flow through the switch 209, the loads 206 and 207, and the switch 212. Also, this current will flow though the switch 209, the loads 206 and 208, and the switch 214.

Figure 9:
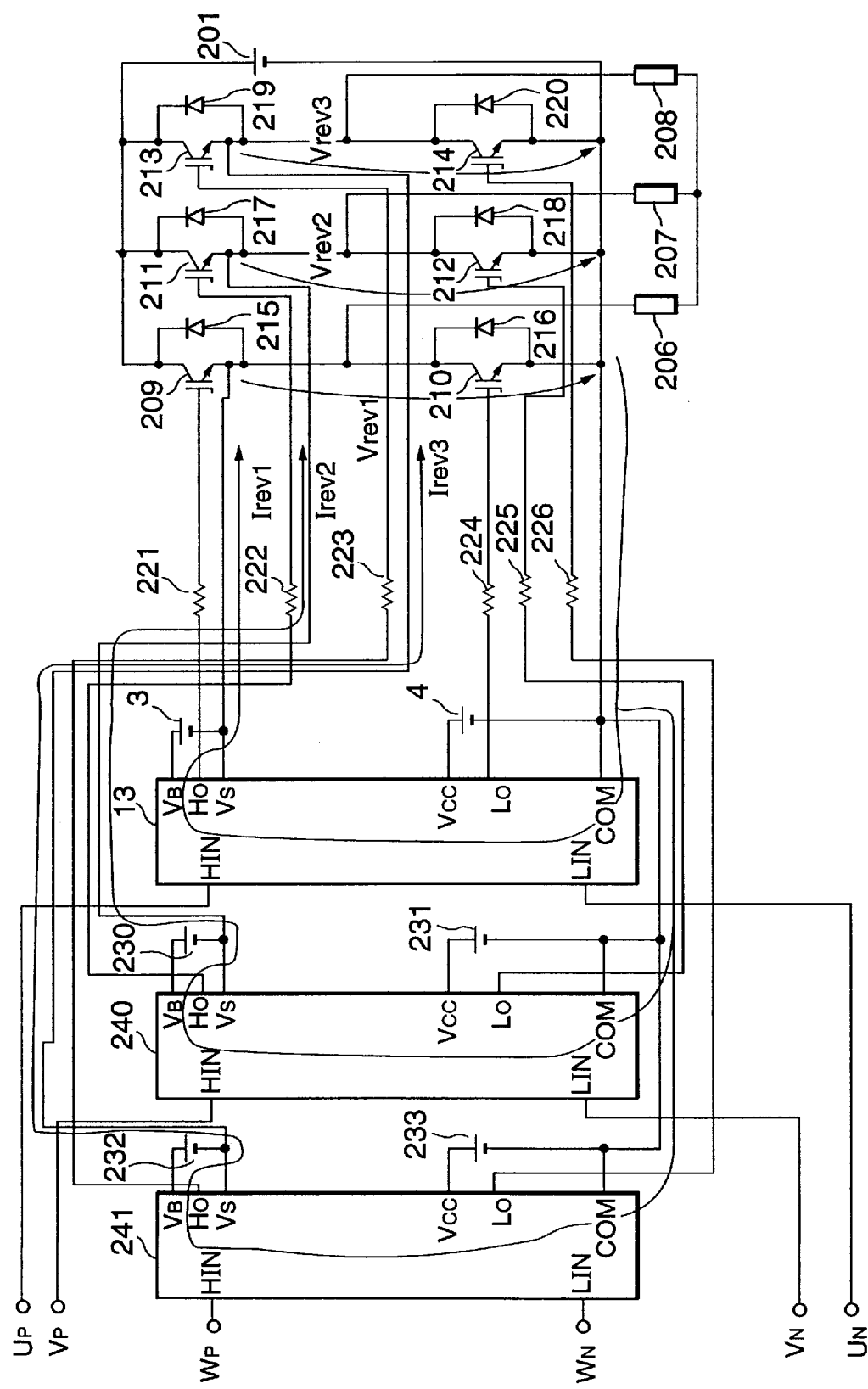
FIG. 9 is a diagram for representing a current path which may cause erroneous operation and electric destruction of the three ICs when the 3-phase power converting circuit is connected to the three ICs.
Figure 26:
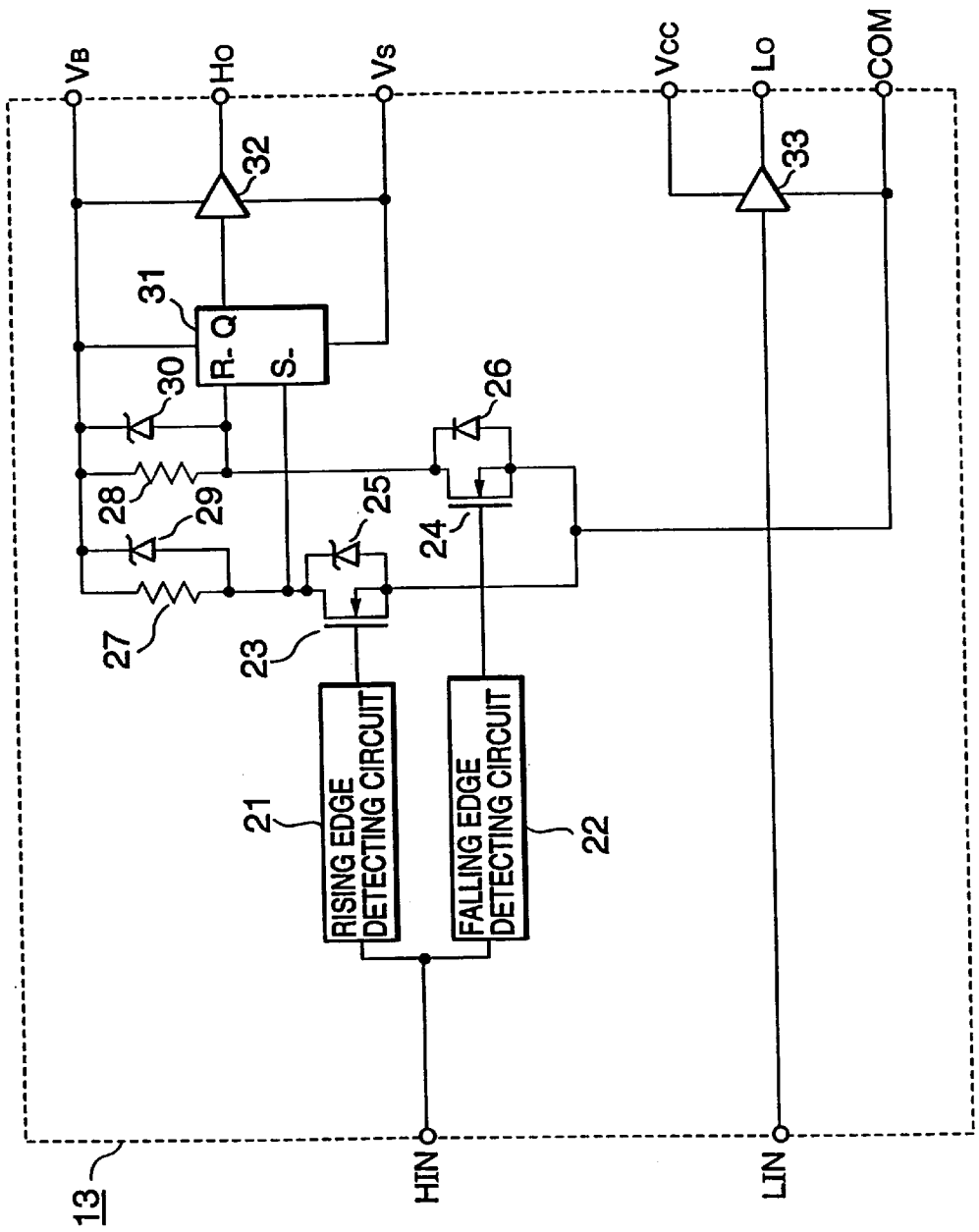
FIG. 26 is a diagram for indicating an internal circuit of an IC.

It should be understood that both the IC 240 and the IC 241 own the same function as the IC 13. In other words, internal circuits of the IC 240 and the IC 241 are represented in a similar manner to FIG. 26. As indicated in FIG. 9, a voltage Vrev1 is produced and a current Irev1 flows; a voltage Vrev2 is produced and a current Irev2 flows; and a voltage Vrev3 is produced and a current Irev3 flows. Subsequently, a description will now be made of such a case that when the voltage Vrev1 is produced, the current Irev1 flows. Since operations as to the above-described current Irev2 and Irev3 are similar to the above operation, explanations thereof are omitted.

Figure 10:
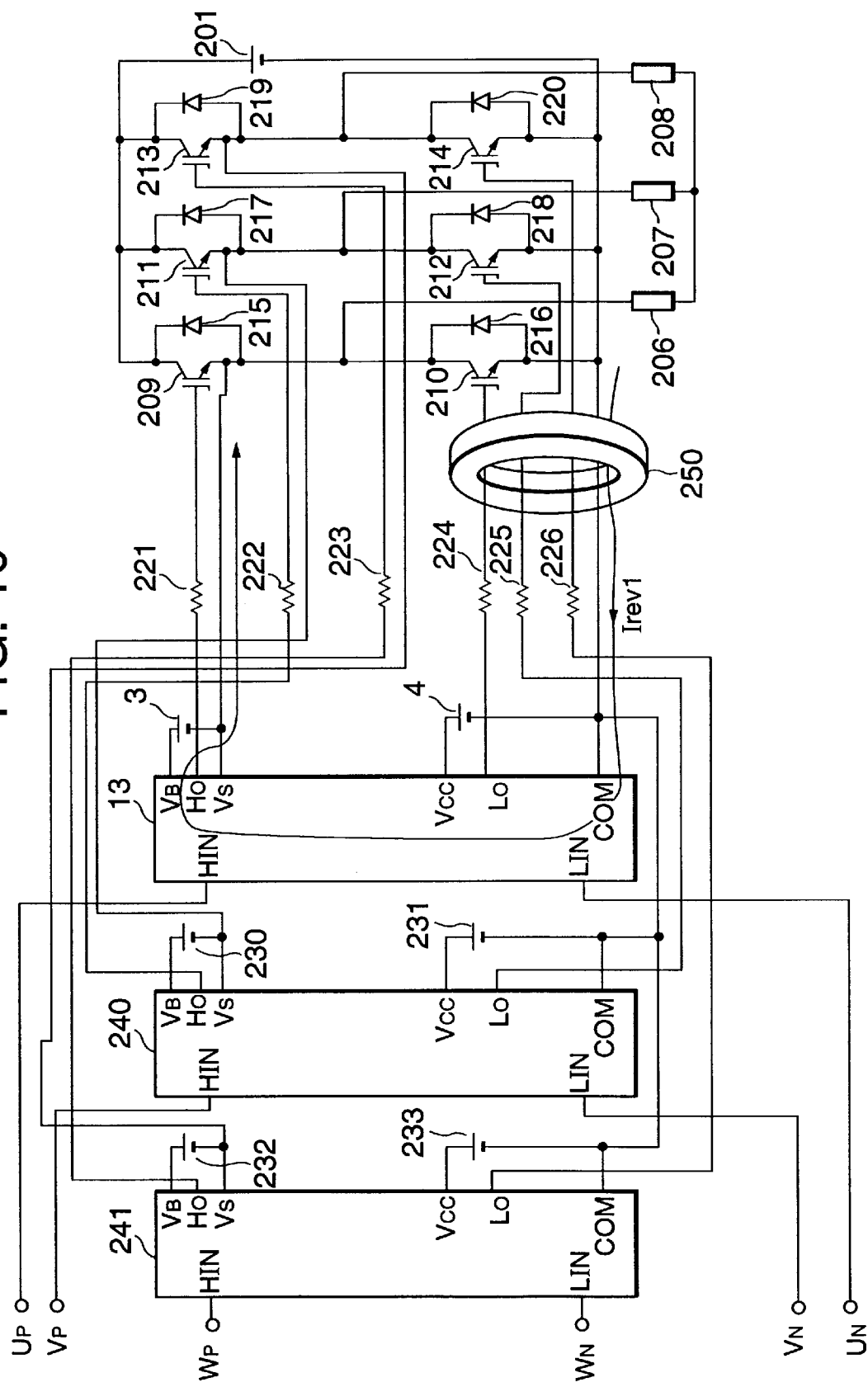
FIG. 10 is a circuit diagram for representing a power converting apparatus according to an embodiment 7.

FIG. 10 indicates a power converting apparatus according to a seventh embodiment of the present invention. In this drawing, reference numerals 3, 4, 13, 201, 206 to 226, 230 to 233, 240, and 241 indicate the same circuit elements of FIG. 8, and explanations thereof are omitted. Reference numeral 250 indicates a core (common mode transformer) made of a material of, for example, ferrite and the like.

In the power converting apparatus with the above-described circuit arrangement, since the current Irev1 penetrates the core 250 by 1 time, the core 250 may function as an inductance component with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 13 from the erroneous operation and the electric destruction.

A current to drive the switches 210, 212, and 214 penetrates the core 250 by 1 time along different directions to each other. The magnetic fluxes produced within the core 250 are canceled with each other, so that the core 250 does not function as an inductance component. In other words, the delay in the drive speeds of the switches 210, 212, and 214 caused by connecting the above-explained core 250 is not produced, but also the erroneous operation of the IC 13 and also the electric destruction thereof can be prevented.

Originally, since the above-described current Irev1 flows through the IC 13, and the current value is low, a low-cost core can be used as the core 250.

Also, although the power converting apparatus shown in FIG. 10 arranged in such a manner that the current Irev1 penetrates the core 250 by 1 time. Alternatively, in general, it may be arranged such that the above-described current Irev1 may penetrate the core 250 by plural times.

Alternatively, although it is arranged by only one core in FIG. 10, it is apparently possible to arrange the power converting apparatus by employing a plurality of cores.

Also, in the drawing, apparently it may be arranged that the drive signal path (namely, terminal HO of IC 13—resistor 221—switch 209—terminal VS of IC 13) via the resistor 221 is connected under twist line condition for suppressing induction noise. Also, similarly, the drive signal path (namely, terminal HO of IC 240—resistor 222—switch 211—terminal VS of IC 240) via the resistor 222 may be connected under twist line condition for suppressing induction noise. Also, similarly, the drive path (terminal HO of IC 241—resistor 223—switch 213—terminal VS of IC 241) via the resistor 223 may be connected under twist line condition for suppressing induction noise.

EMBODIMENT 8

Figure 11:
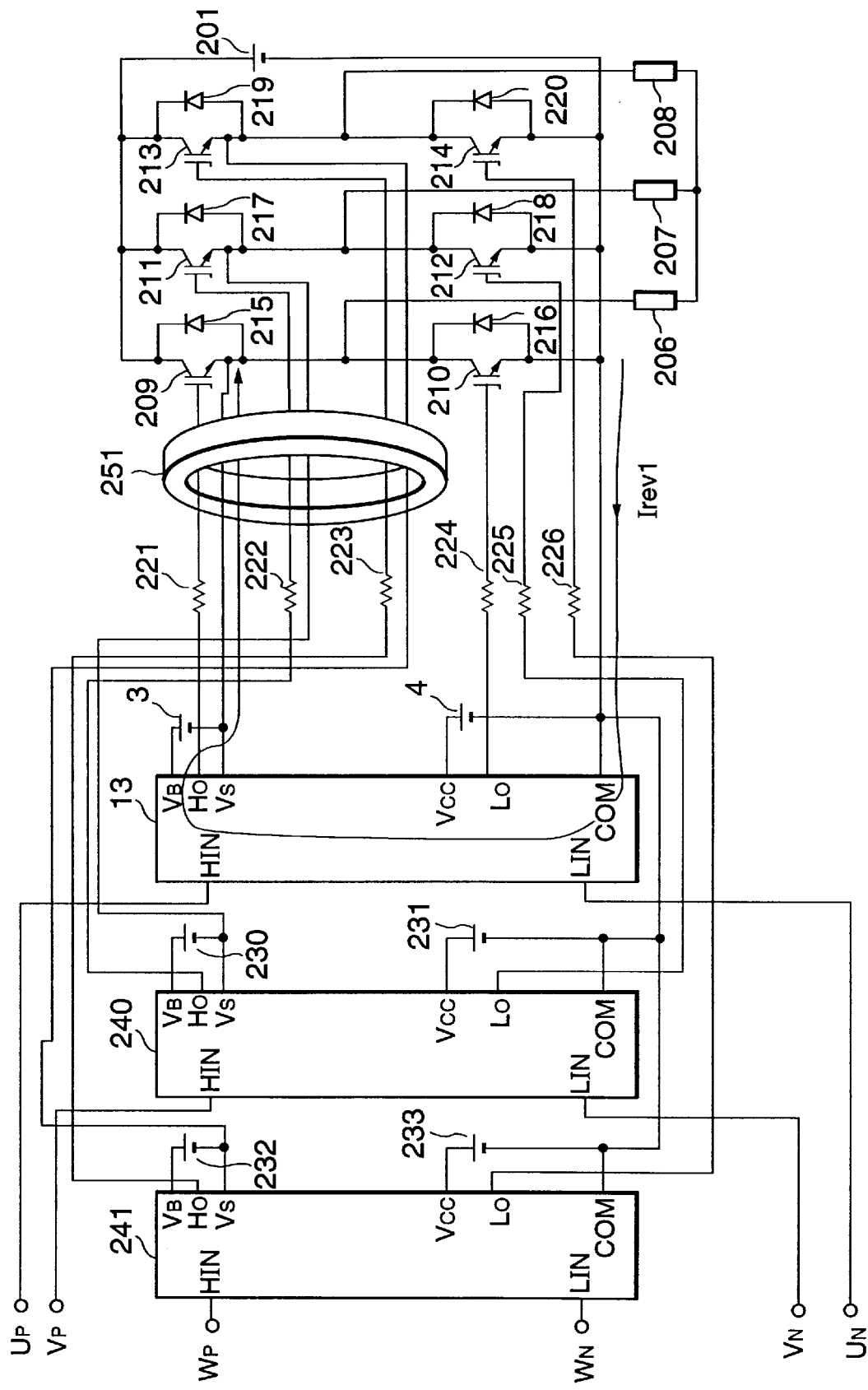
FIG. 11 is a circuit diagram for representing a power converting apparatus according to an embodiment 8.

FIG. 11 indicates a power converting apparatus according to an eighth embodiment of the present invention. In this drawing, reference numerals 3, 4, 13, 201, 206 to 226, 230 to 233, 240, and 241 indicate the same circuit elements of FIG. 8, and explanations thereof are omitted. Reference numeral 251 indicates a core (common mode transformer) made of a material of, for example, ferrite and the like.

In the power converting apparatus with the above-described circuit arrangement, since the current Irev1 penetrates the core 251 by 1 time, the core 251 may function as an inductance component with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 13 from the erroneous operation and the electric destruction.

A current to drive the switches 209, 211, and 213 penetrates the core 251 by 1 time along different directions to each other. The magnetic fluxes produced within the core 251 are canceled with each other, so that the core 251 does not function as an inductance component. In other words, the delay in the drive speeds of the switches 209, 211, and 213 caused by connecting the above-explained core 251 is not produced, but also the erroneous operation of the IC 13 and also the electric destruction thereof can be prevented.

Originally, since the above-described current Irev1 flows through the IC 13, and the current value is low, a low-cost core can be used as the core 251.

Also, the power converting apparatus shown in FIG. 11 is arranged in such a manner that the current Irev1 penetrates the core 251 by 1 time. Alternatively, in general, it may be arranged such that the above-described current Irev1 may penetrate the core 251 by plural times.

Alternatively, although it is arranged by only one core in FIG. 11, it is apparently possible to arrange the power converting apparatus by employing a plurality of cores.

Also, in the drawing, apparently it may be arranged that the drive signal path (namely, terminal HO of IC 13—resistor 221—switch 209—terminal VS of IC 13) via the resistor 221 is connected under twist line condition for suppressing induction noise. Also, similarly, the drive signal path (namely, terminal HO of IC 240—resistor 222—switch 211—terminal VS of IC 240) via the resistor 222 may be connected under twist line condition for suppressing induction noise. Also, similarly, the drive path (terminal HO of IC 241—resistor 223—switch 213—terminal VS of IC 241) via the resistor 223 may be connected under twist line condition for suppressing induction noise.

EMBODIMENT 9

Figure 12:
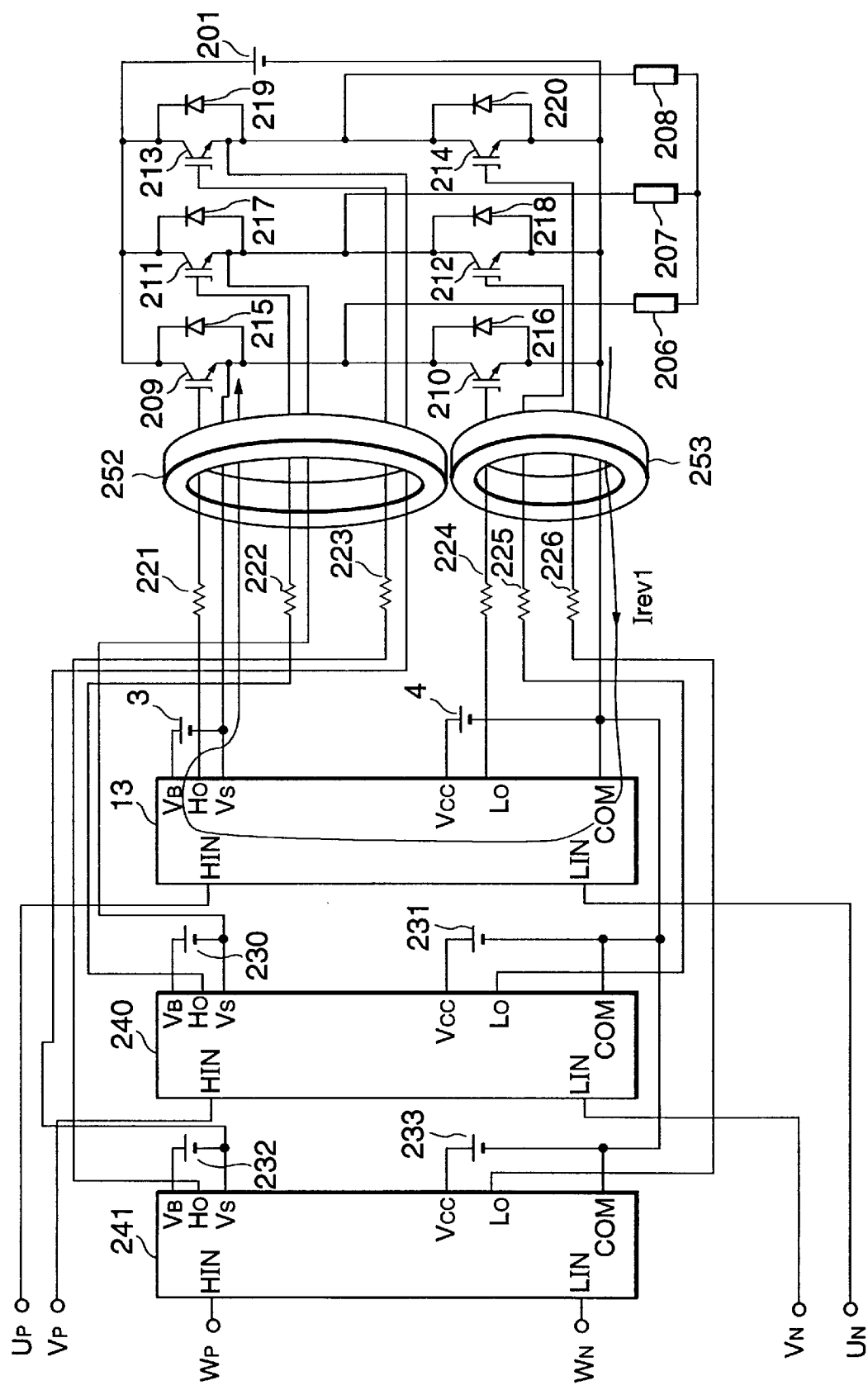
FIG. 12 is a circuit diagram for representing a power converting apparatus according to an embodiment 9.

FIG. 12 indicates a power converting apparatus according to a ninth embodiment of the present invention. In this drawing, reference numerals 3, 4, 13, 201, 206 to 226, 230 to 233, 240, and 241 indicate the same circuit elements of FIG. 8, and explanations thereof are omitted. Reference numerals 252 and 253 indicate cores (common mode transformers) made of a material of, for example, ferrite and the like.

In the power converting apparatus with the above-described circuit arrangement, since the current Irev1 penetrates the core 252 by 1 time and the core 253 by 1 time, the cores 251 and 252 may function as inductance components with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 13 from the erroneous operation and the electric destruction.

A current used to drive the switches 210, 212, and 214 penetrates the core 253 by 1 time along different directions to each other. The magnetic fluxes produced within the core 253 are canceled with each other, so that the core 253 does not function as an inductance component. In other words, the delay in the drive speeds of the switches 210, 212, and 214 caused by connecting the above-explained core 253 is not produced, but also the erroneous operation of the IC 13 and also the electric destruction thereof can be prevented.

Also, a current used to drive the switches 209, 211, and 213 penetrates the core 252 by 1 time along different directions to each other. The magnetic fluxes produced within the core 252 are canceled with each other, so that the core 252 does not function as an inductance component. In other words, the delay in the drive speeds of the switches 209, 211, and 213 caused by connecting the above-explained core 252 is not produced, but also the erroneous operation of the IC 13 and also the electric destruction thereof can be prevented.

Originally, since the above-described current Irev1 flows through the IC 13, and the current value is low, a low-cost core can be used as the cores 252 and 253.

It should be noted that although the power converting apparatus of FIG. 12 is arranged in such a manner that the current Irev1 penetrates the core 252 and the core 253 by 1 time respectively, generally speaking, it may be so arranged that the above-described current Irev1 may pass through the cores 252 and 253 plural times.

Alternatively, it is apparently possible to arrange the power converting apparatus by employing a plurality of the above-described cores 252 and 253, although the power converting apparatus of FIG. 12 is arranged by one core, respectively.

Also, in the drawing, apparently it may be arranged that the drive signal path (namely, terminal HO of IC 13—resistor 221—switch 209—terminal VS of IC 13) via the resistor 221 is connected under twist line condition for suppressing induction noise. Also, similarly, the drive signal path (namely, terminal HO of IC 240—resistor 222—switch 211—terminal VS of IC 240) via the resistor 222 may be connected under twist line condition for suppressing induction noise. Also, similarly, the drive path (terminal HO of IC 241—resistor 223—switch 213—terminal VS of IC 241) via the resistor 223 may be connected under twist line condition for suppressing induction noise.

EMBODIMENT 10

Figure 13:
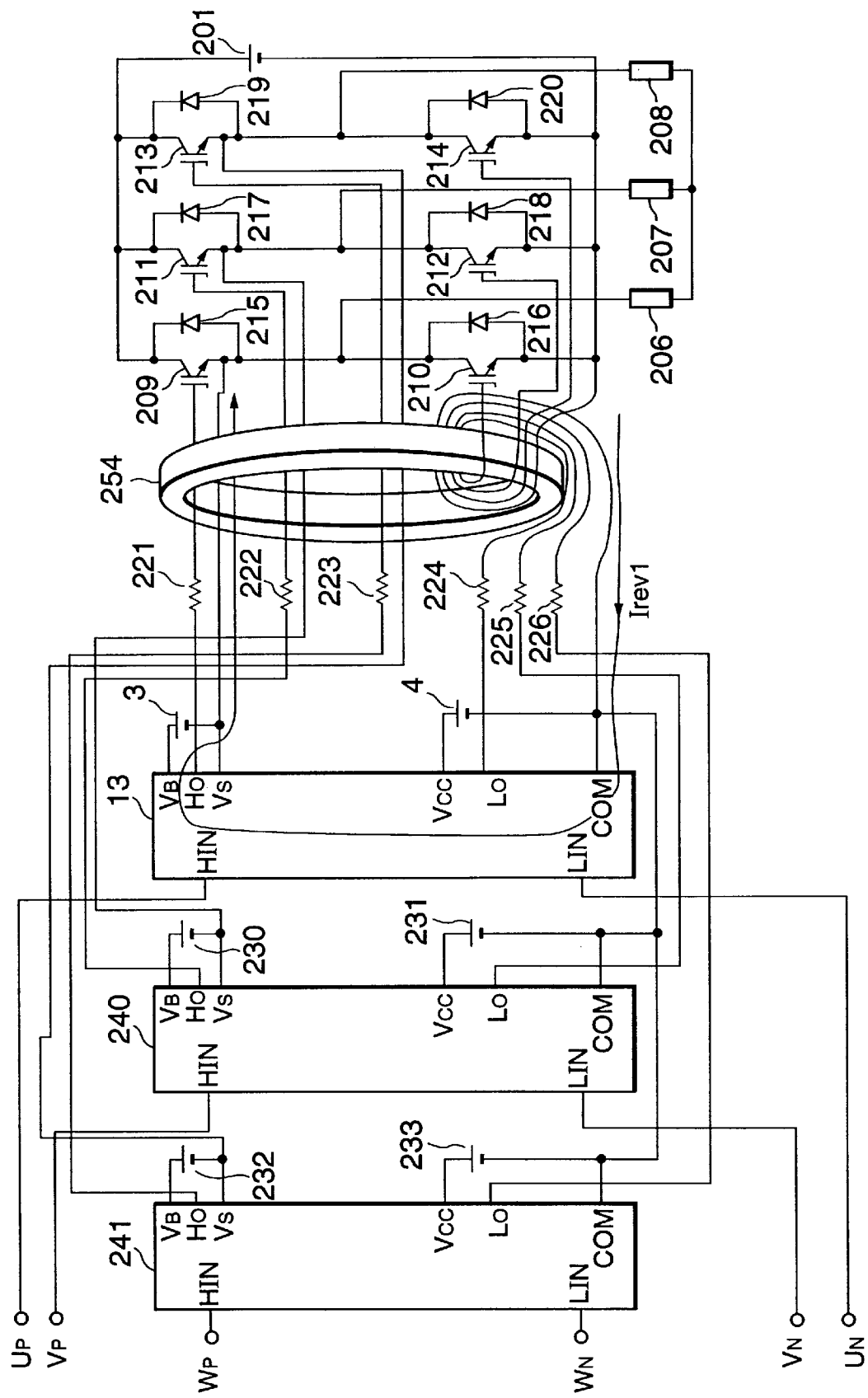
FIG. 13 is a circuit diagram for representing a power converting apparatus according to an embodiment 10.

FIG. 13 indicates a power converting apparatus according to a tenth embodiment of the present invention. In this drawing, reference numerals 3, 4, 13, 201, 206 to 226, 230 to 233, 240, and 241 indicate the same circuit elements of FIG. 8, and explanations thereof are omitted. Reference numeral 254 indicates a core (common mode transformer) made of a material of, for example, ferrite and the like.

In the power converting apparatus with the above-described circuit arrangement, since the current Irev1 penetrates the core 254 by 2 times, the core 254 may function as an inductance component with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 13 from the erroneous operation and the electric destruction.

A current used to drive the switches 209 to 214 penetrates the core 254 by 1 time along different directions to each other. The magnetic fluxes produced within the core 254 are canceled with each other, so that the core 254 does not function as an inductance component. In other words, the delay in the drive speeds of the switches 209 to 214 caused by connecting the above-explained core 254 is not produced, but also the erroneous operation of the IC 13 and also the electric destruction thereof can be prevented.

Originally, since the above-described current Irev1 flows through the IC 13, and the current value is low, a low-cost core can be used as the core 254.

It should be noted that it may be so arranged that the above-described current Irev1 may pass through the core 254 more plural times.

Alternatively, it is apparently possible to arrange the power converting apparatus by employing a plurality of cores 254.

Also, under such a condition that only one core is used due to low cost and also, as represented in FIG. 2, the same drive wiring line cannot penetrate such a single core by more than 2 times because of the arrangement of the power converting apparatus, only such an impedance of a single core is merely obtained with respect to the current Irev in the embodiments 7 to 9. To the contrary, according to this embodiment, since the impedance for two sets of cores can be obtained, the currents Irev1 to Irev3 can be furthermore suppressed.

Also, in the drawing, apparently it may be arranged that the drive signal path (namely, terminal HO of IC 13—resistor 221—switch 209—terminal VS of IC 13) via the resistor 221 is connected under twist line condition for suppressing induction noise. Also, similarly, the drive signal path (namely, terminal HO of IC 240—resistor 222—switch 211—terminal VS of IC 240) via the resistor 222 may be connected under twist line condition for suppressing induction noise. Also, similarly, the drive path (terminal HO of IC 241—resistor 223—switch 213—terminal VS of IC 241) via the resistor 223 may be connected under twist line condition for suppressing induction noise.

EMBODIMENT 11

Figure 14:
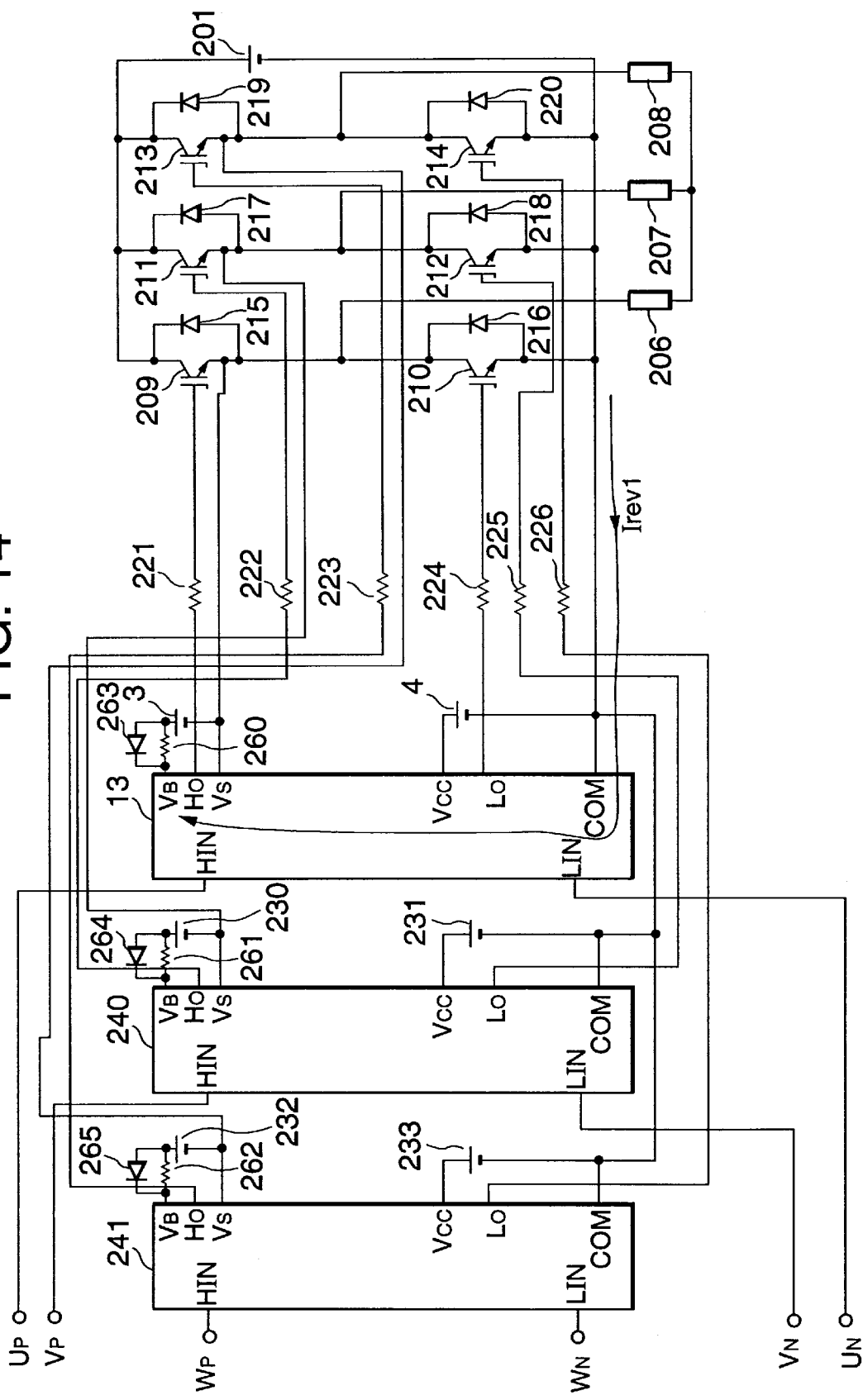
FIG. 14 is a circuit diagram for representing a power converting apparatus according to an embodiment 11.

FIG. 14 indicates a power converting apparatus according to an eleventh embodiment of the present invention. In this drawing, reference numerals 3, 4, 13, 201, 206 to 226, 230 to 233, 240, and 241 indicate the same circuit elements of FIG. 8, and explanations thereof are omitted. Reference numerals 260 to 262 indicate resistors, and reference numerals 263 to 265 show diodes.

In the power converting apparatus with the above-described circuit arrangement, since the resistor 206 is present in the signal path through which the current Irev1 flows, this current Irev1 can be suppressed. As a result, it is possible to prevent the IC 13 from the erroneous operation and the electric destruction.

Also, since an impedance component is not newly added to a current path used to drive the switches 209, 211, and 213 under ON states, there is no delay in the drive speeds of the switches 209, 211, and 213. It is, of course, no problem in such a case that the switches 209, 211, and 213 are driven to the OFF states.

Also, since the above-described diode 263 is connected via the power supply 3 to the VB-terminal of the IC 13 and the VS-terminal thereof, such a diode having a low rating voltage may be used, so that a low-cost diode may be employed as the diode 263. Also, since the diode 264 is connected via the power supply 230 to the VB-terminal of the IC 240 and the VS-terminal thereof, and also the diode 265 is connected via the power supply 232 to the VB-terminal of the IC 241 and the VS-terminal thereof, such diodes having low rating voltage may be used, so that low-cost diodes may be employed as these diodes 264 and 265.

Also, in the drawing, apparently it may be arranged that the drive signal path (namely, terminal HO of IC 13—resistor 221—switch 209—terminal VS of IC 13) via the resistor 221 is connected under twist line condition for suppressing induction noise. Also, similarly, the drive signal path (namely, terminal HO of IC 240—resistor 222—switch 211—terminal VS of IC 240) via the resistor 222 may be connected under twist line condition for suppressing induction noise. Also, similarly, the drive path (terminal HO of IC 241—resistor 223—switch 213—terminal VS of IC 241) via the resistor 223 may be connected under twist line condition for suppressing induction noise.

EMBODIMENT 12

In the case that the above-described DC power supplies 3, 230, and 232 are, for instance, such DC power supplies containing high frequency noise and high frequency ripples such as a switching power supply, there are some possibilities that decoupling capacitors having a small capacitance and a better high frequency characteristic are connected between the VB-terminals and the VS-terminals, corresponding to the power supply voltage terminals of the IC 13, the IC 240, and the IC 241 in order not apply the noise and the ripple component. In this case, the current Irev1, the current Irev2, and the current Irev3 will flow through the above-described decoupling capacitors, so that the IC 13, the IC 240, and the IC 241 are erroneously operated, and is electrically destroyed.

Figure 15:
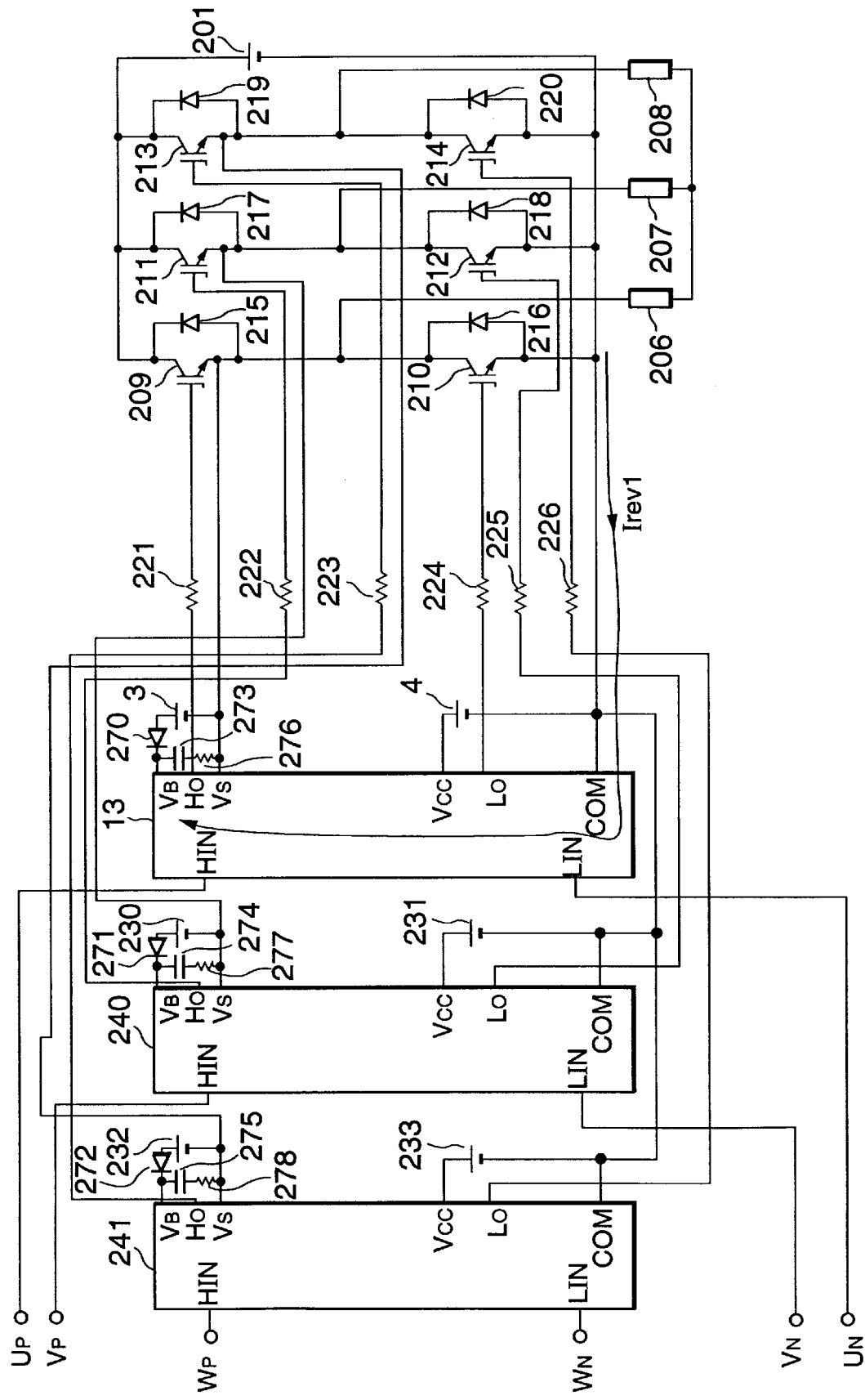
FIG. 15 is a circuit diagram for representing a power converting apparatus according to an embodiment 12.

FIG. 15 indicates a power converting apparatus according to a twelfth embodiment of the present invention. In this drawing, reference numerals 3, 4, 13, 201, 206 to 226, 230 to 233, 240, and 241 indicate the same circuit elements of FIG. 8, and explanations thereof are omitted. Reference numerals 270 to 272 indicate diodes, reference numerals 273 to 275 show capacitors functioning as decoupling capacitors, and reference numerals 276 to 278 are resistors.

The above-described current Irev1 is blocked by the diode 270, and there is no path through which the current passes via the DC power supply 3. As a consequence, the current Irev1 will flow via the capacitor 273. However, since the resistor 277 is present, the current Irev1 is suppressed, so that the erroneous operation of the IC 13 and the electric destruction thereof can be avoided. Also, if the resistance value of the resistor 276 may be set to a small value, then the impedance of the high frequency component with respect to the DC power supply 3 is not so increased. As a consequence, the high frequency noise and the high frequency ripple in the DC power supply 3 can be absorbed in the path of the capacitor 273 and the resistor 276.

Also, in the drawing, apparently it may be arranged that the drive signal path (namely, terminal HO of IC 13—resistor 221—switch 209—terminal VS of IC 13) via the resistor 221 is connected under twist line condition for suppressing induction noise. Also, similarly, the drive signal path (namely, terminal HO of IC 240—resistor 222—switch 211—terminal VS of IC 240) via the resistor 222 may be connected under twist line condition for suppressing induction noise. Also, similarly, the drive path (terminal HO of IC 241—resistor 223—switch 213—terminal VS of IC 241) via the resistor 223 may be connected under twist line condition for suppressing induction noise.

EMBODIMENT 13

Figure 16:
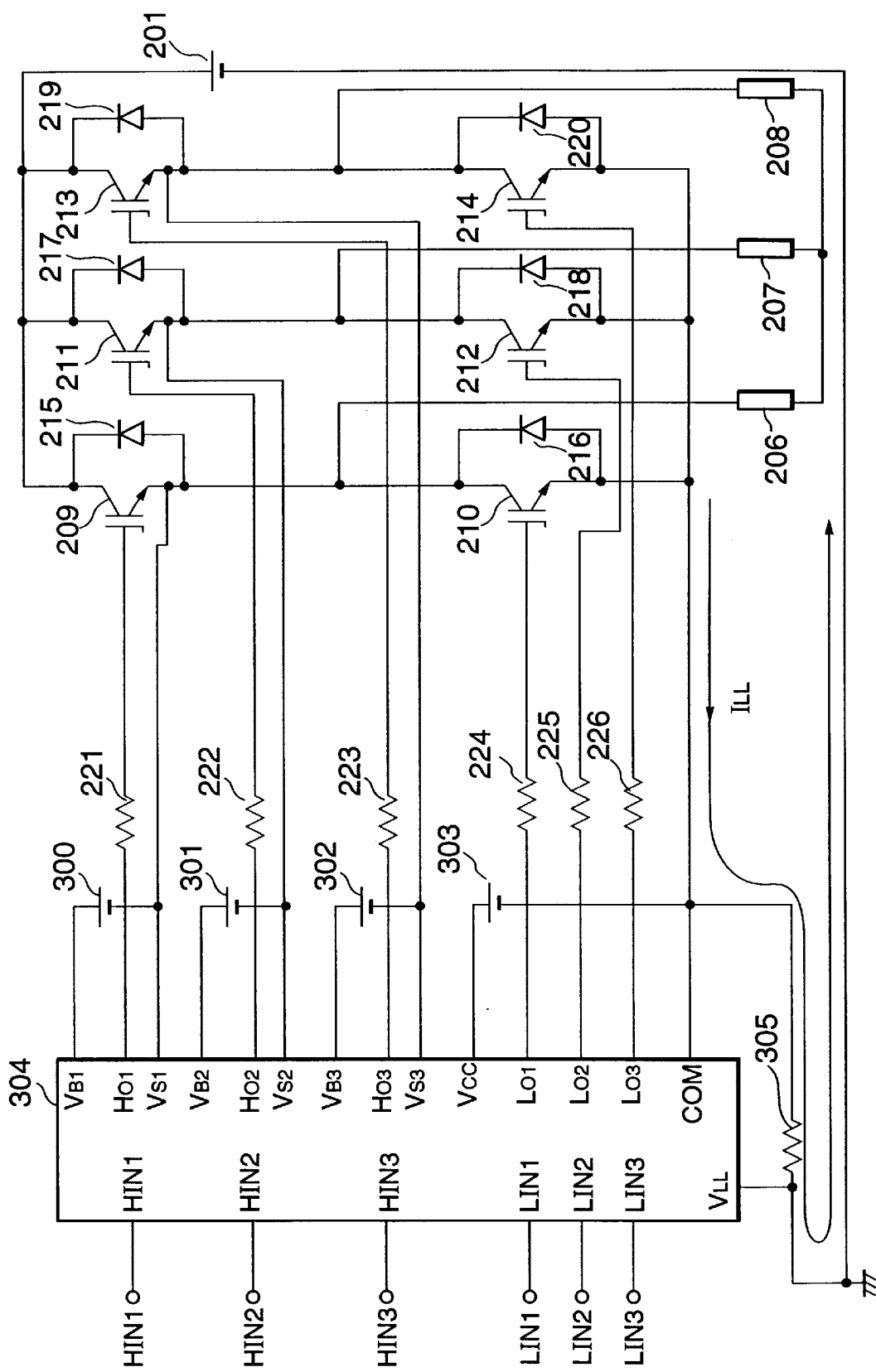
FIG. 16 is a circuit diagram for indicating a method for connecting a 3-phase power converting circuit to a single IC.
Figure 17:
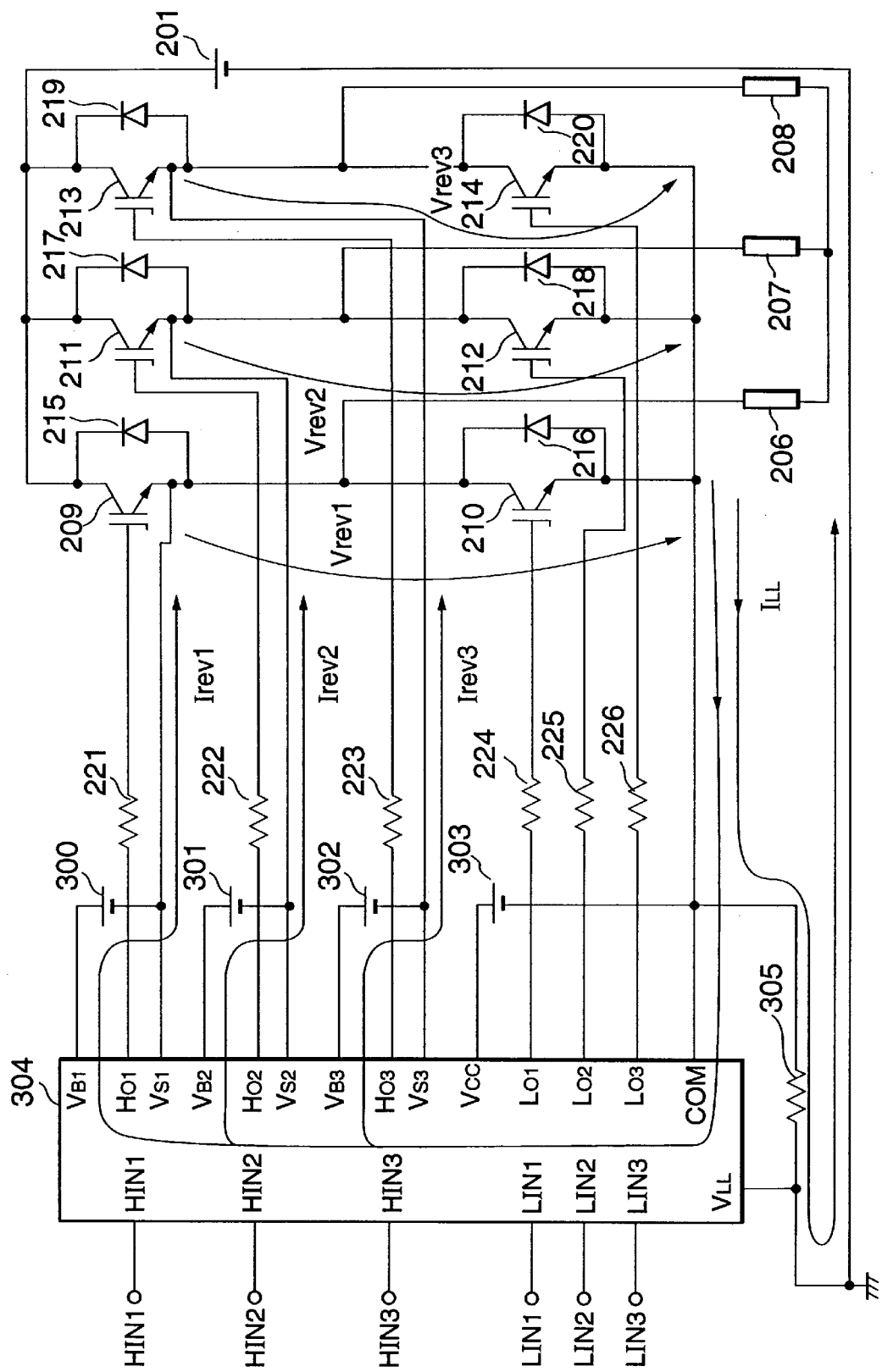
FIG. 17 is a circuit diagram for representing a current path which may cause erroneous operation and electric destruction of the IC when the 3-phase power converting circuit is connected to a single IC.

FIG. 16 represents such a case that a 3-phase power converting circuit is driven by a single IC. In this drawing, reference numerals 201, and 206 to 226 indicate the same circuit elements of FIG. 8, and explanations thereof are omitted. Reference numerals 300 to 303 show DC power supplies; reference numeral 304 indicates an IC for driving the above-explained switches 209 and 214; and reference numeral 305 denotes a resistor for detecting a current ILL flowing thorough a 3-phase power converting circuit constructed of the above-described switches 209 to 214 and diodes 215 to 220.

The above-described DC power supply 300 is a power supply for supplying electric power between a VB1-terminal and a VS1-terminal, equal to power supply voltage supplying terminals of the IC 304 for driving the switch 209, and the above-described DC power supply 301 is a power supply for supplying electric power between a VB2-terminal and a VS2-terminal, equal to power supply voltage supplying terminals of the IC 304 for driving the switch 211. The above-described DC power supply 302 is a power supply for supplying electric power between a VB3-terminal and a VS3-terminal, equal to power supply voltage supplying terminals of the IC 304 for driving the switch 213, and the above-described DC power supply 303 is a power supply for supplying electric power between a VCC-terminal and a COM-terminal, equal to power supply voltage supplying terminals of the IC 304 for driving the switches 210, 212, and 214.

In the above-described IC 304, a signal HIN1 corresponding to the switch 209 is entered, another signal LIN1 corresponding to the switch 210 is entered, another signal HIN2 corresponding to the switch 211 is entered, another signal LIN2 corresponding to the switch 212 is entered, another signal HIN3 corresponding to the switch 213 is entered, another signal LIN3 corresponding to the switch 214 is entered. When the signal HIN1 is high, the output HO1 of the IC 304 becomes high, whereas the signal HIN1 is low, the output HO1 of this IC 304 becomes low. Similar to the above case, when the signal LIN1 is high, the output LO1 of the IC 304 becomes high, whereas the signal LIN1 is low, the output LO1 of the IC 304 becomes low. Also, similar to the above case, when the signal HIN2 is high, the output HO2 of the IC 304 become high, whereas when the signal HIN2 is low, the output HO2 of the IC 304 becomes low. Similarly, when the signal LIN2 is high, the output LO2 of the IC 304 becomes high, whereas the signal LIN2 is low, the output LO2 of this IC 304 becomes low. Similar to the above case, when the signal HIN3 is high, the output HO3 of the IC 304 becomes high, whereas the signal HIN3 is low, the output HO3 of the IC 304 become low. Also, similar to the above case, when the signal LIN3 is high, the output LO3 of the IC 304 becomes high, whereas when the signal LIN3 is low, the output LO3 of the IC 304 becomes low.

The IC 304 detects a voltage of the resistor 305 produced by a current flowing though the above-described 3-phase power converting circuit. When this detected voltage is higher than a preselected level, the IC 304 judges that an excessive current has flown through this 3-phase power converting circuit, and then forcibly turns OFF the above-described switches 209 to 214.

Figure 27:
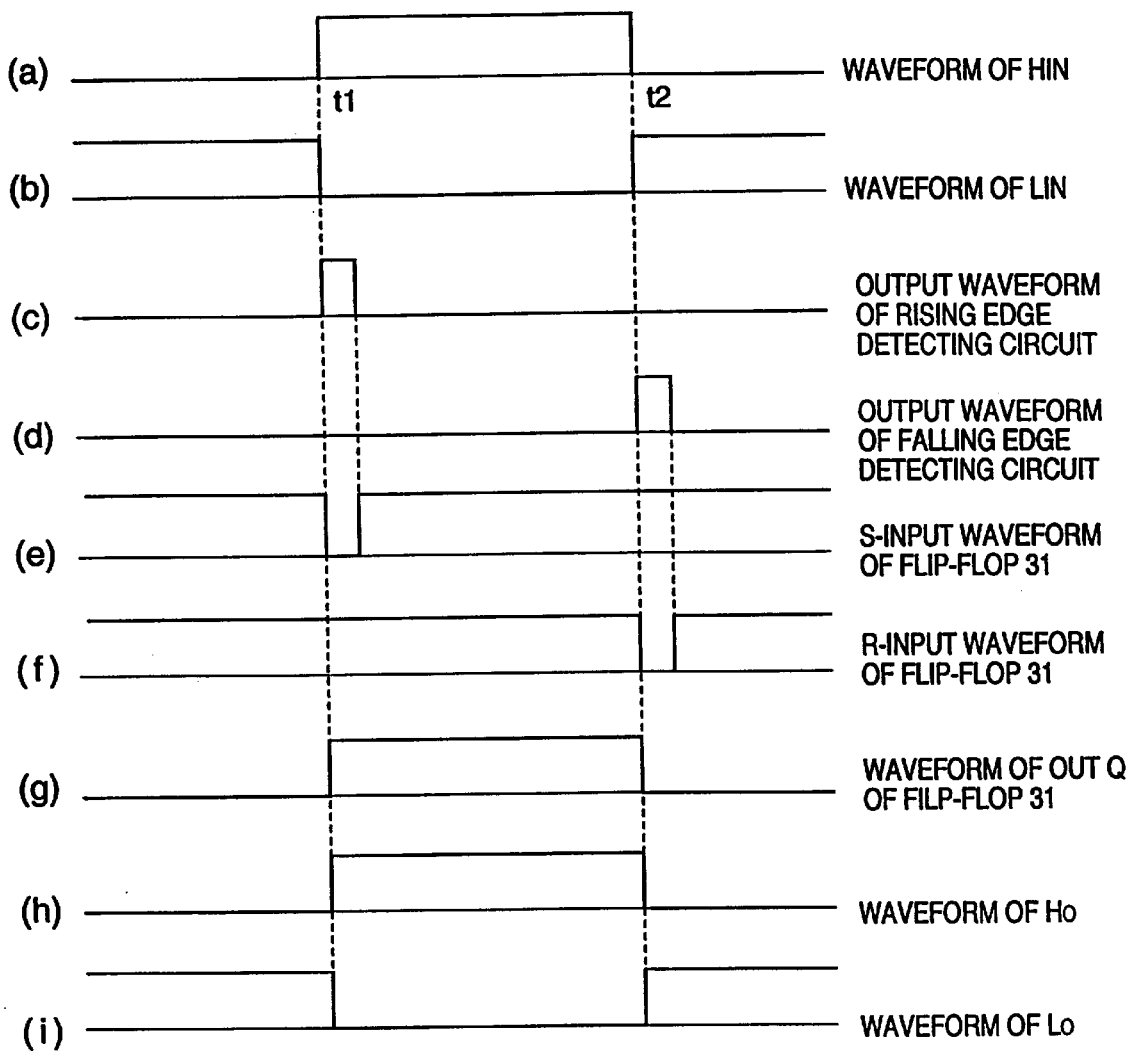
FIG. 27 is a diagram for explaining operation of the IC.
Figure 28:
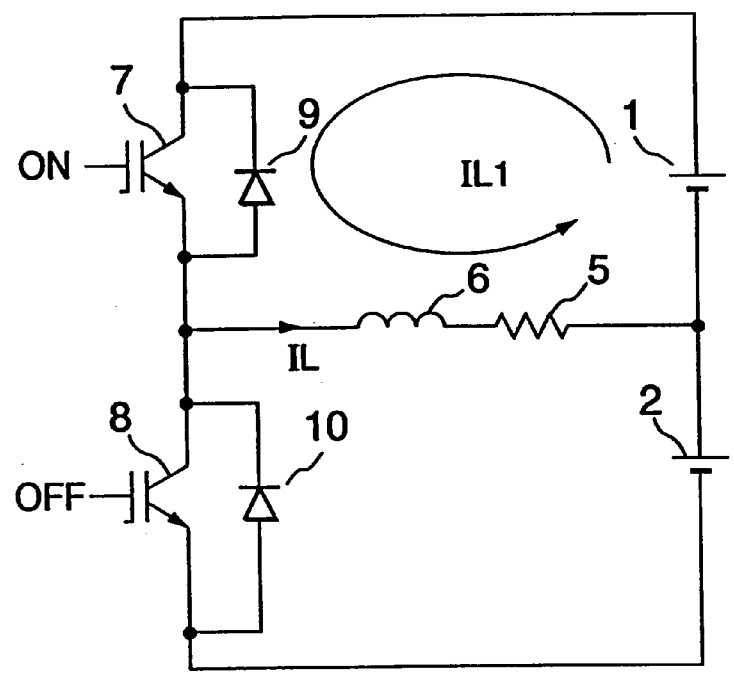
FIG. 28 is a diagram for showing the operation of the conventional power converting apparatus.
Figure 29:
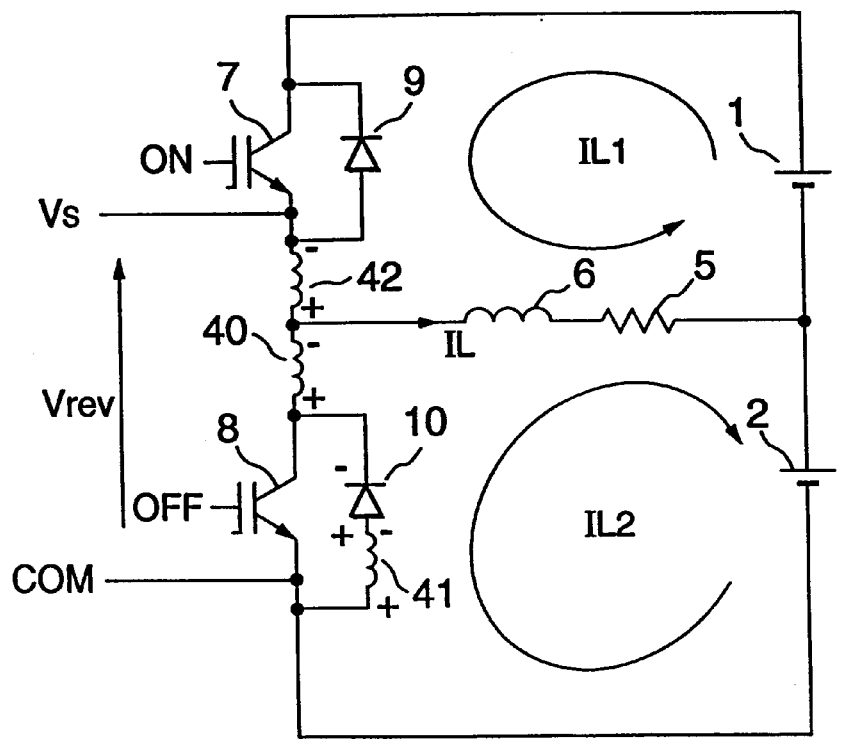
FIG. 29 is a diagram for showing the operation of the conventional power converting apparatus.
Figure 30:
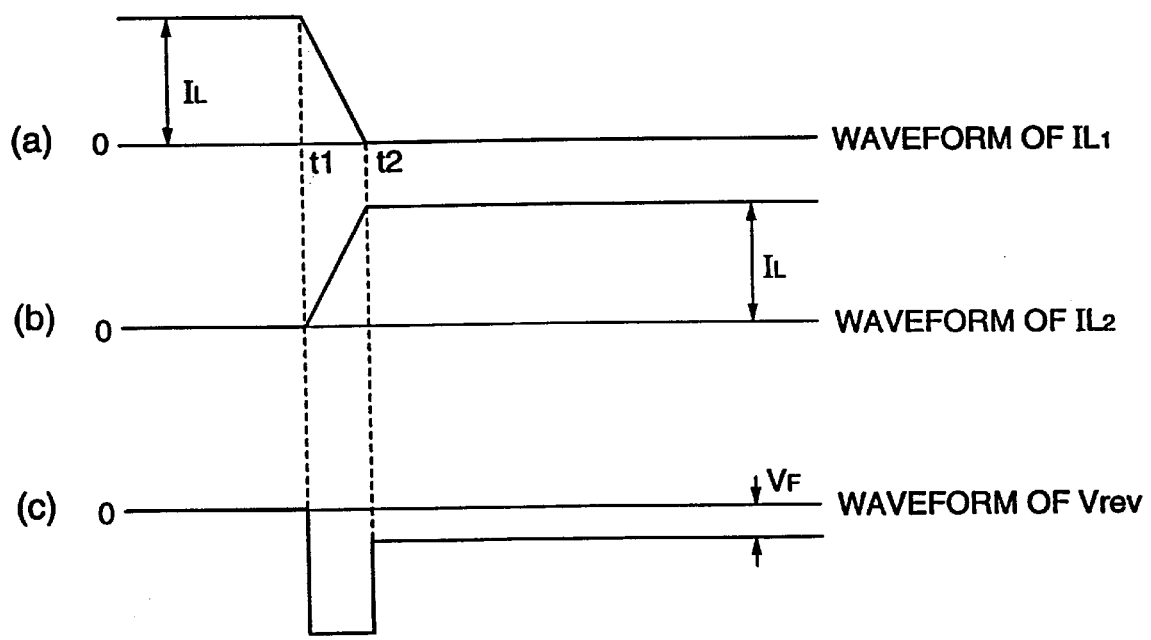
FIG. 30 is a diagram for representing the voltages and the currents in the conventional power converting apparatus.
Figure 31:
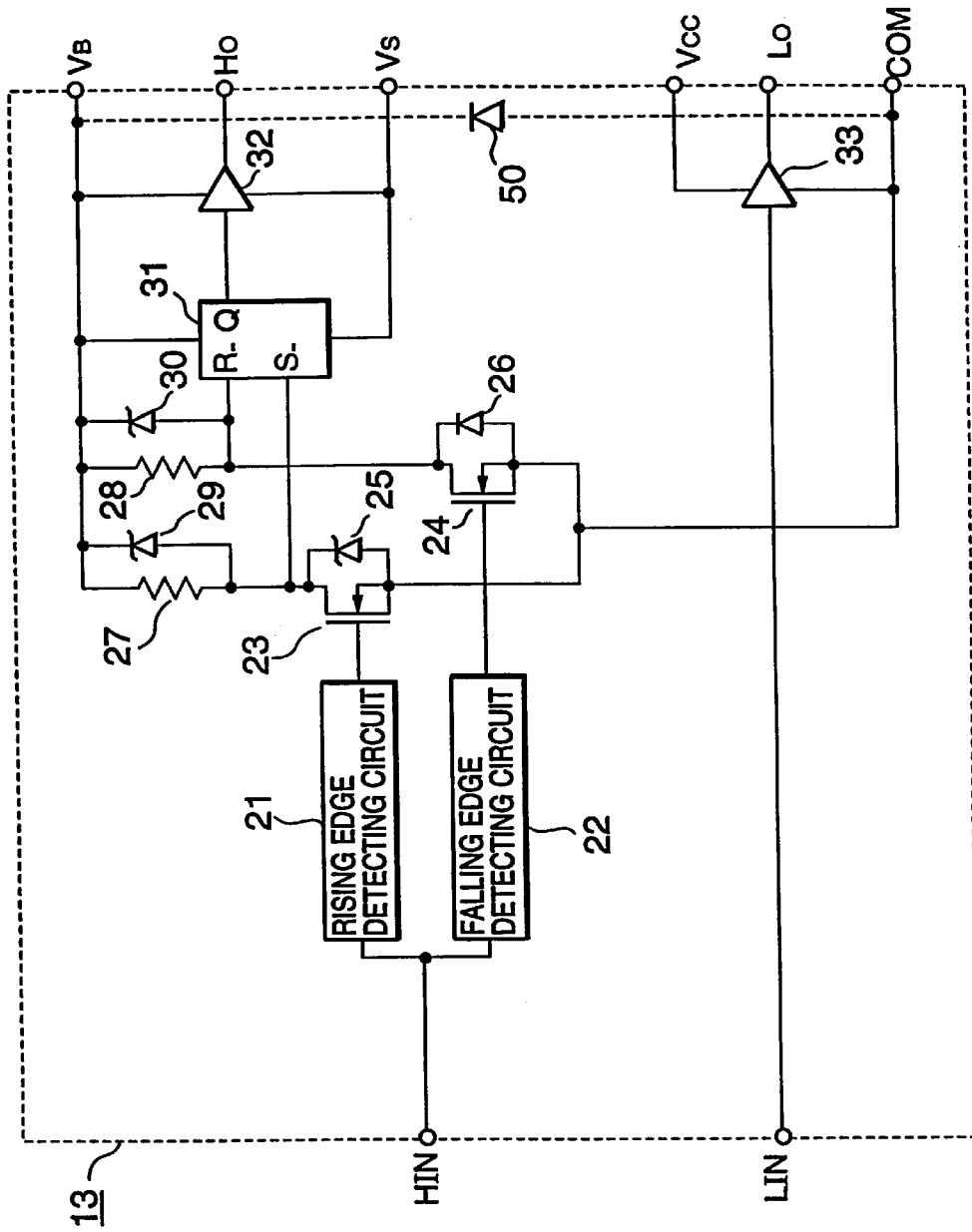
FIG. 31 is a diagram for showing the internal circuit of the IC.
Figure 32:
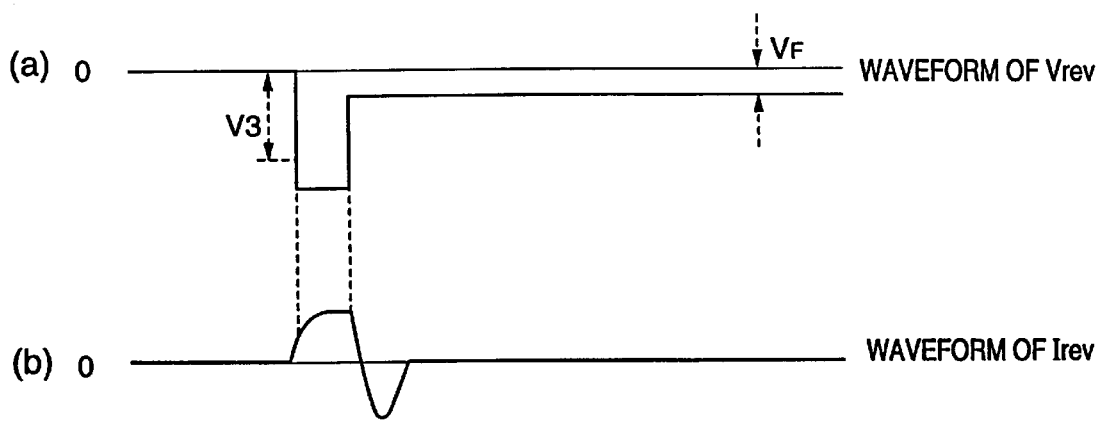
FIG. 32 is a diagram for denoting the mechanism as to how the current flows through the IC.
Figure 33:
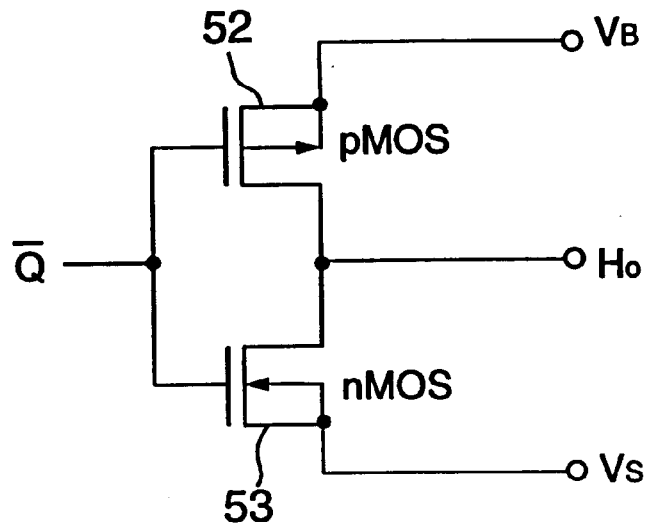
FIG. 33 is a diagram for indicating the buffer amplifier structure of the IC.
Figure 34:
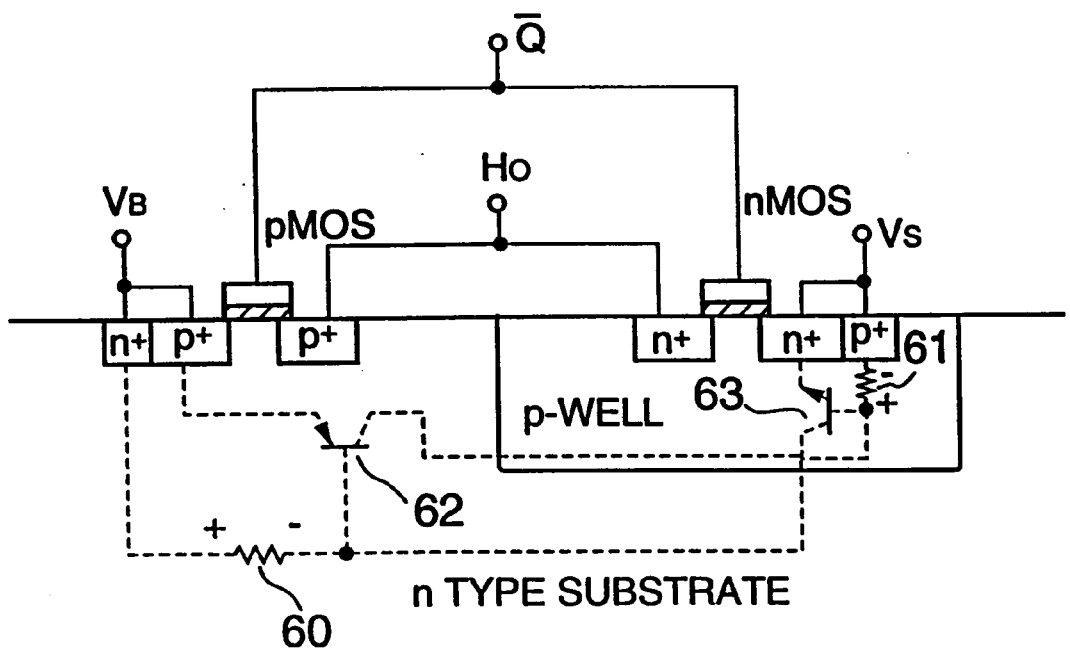
FIG. 34 is a diagram for indicating the buffer amplifier structure of the IC.
Figure 35:
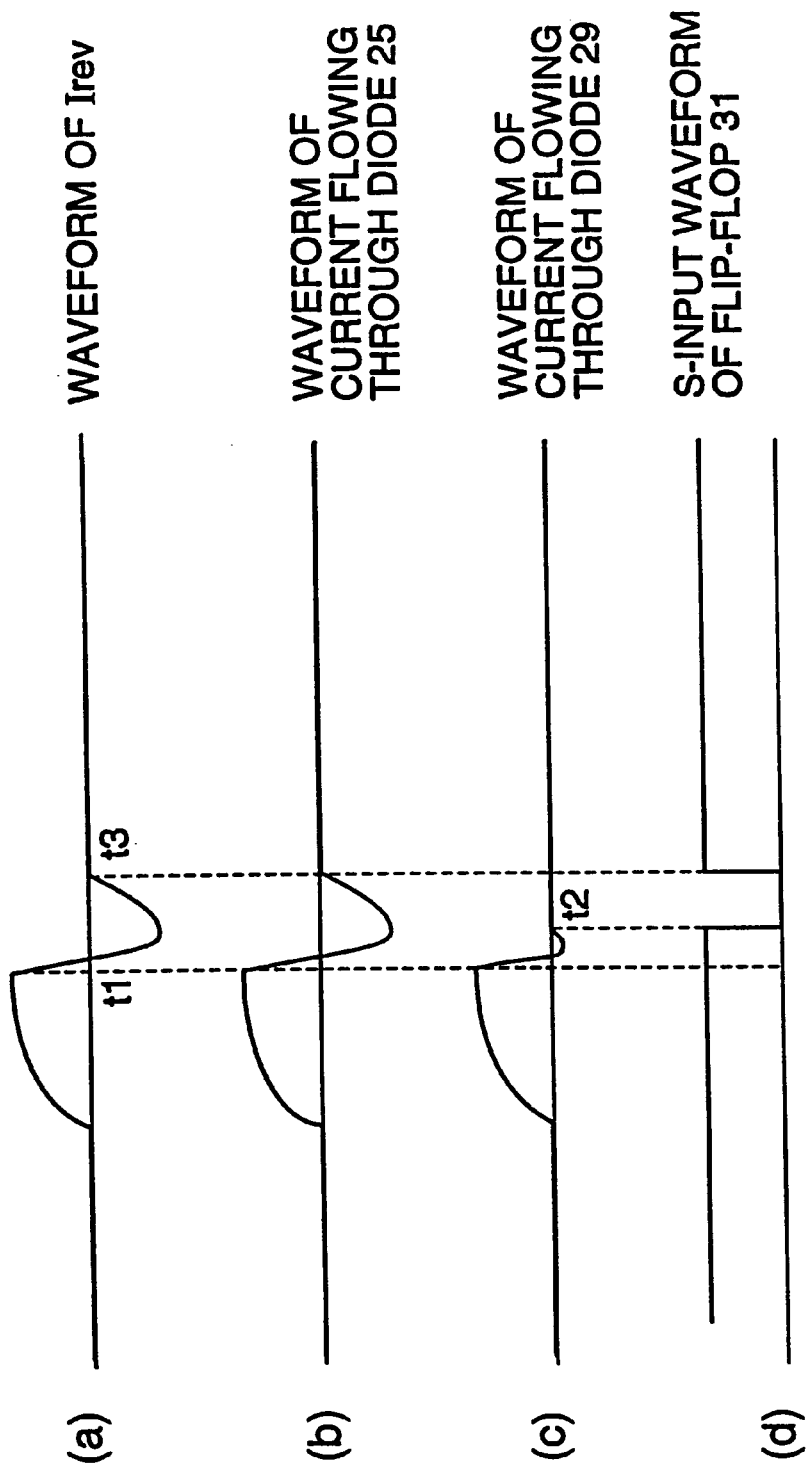
FIG. 35 is a diagram for representing the mechanism as to how the IC is erroneously operated.
Figure 36:
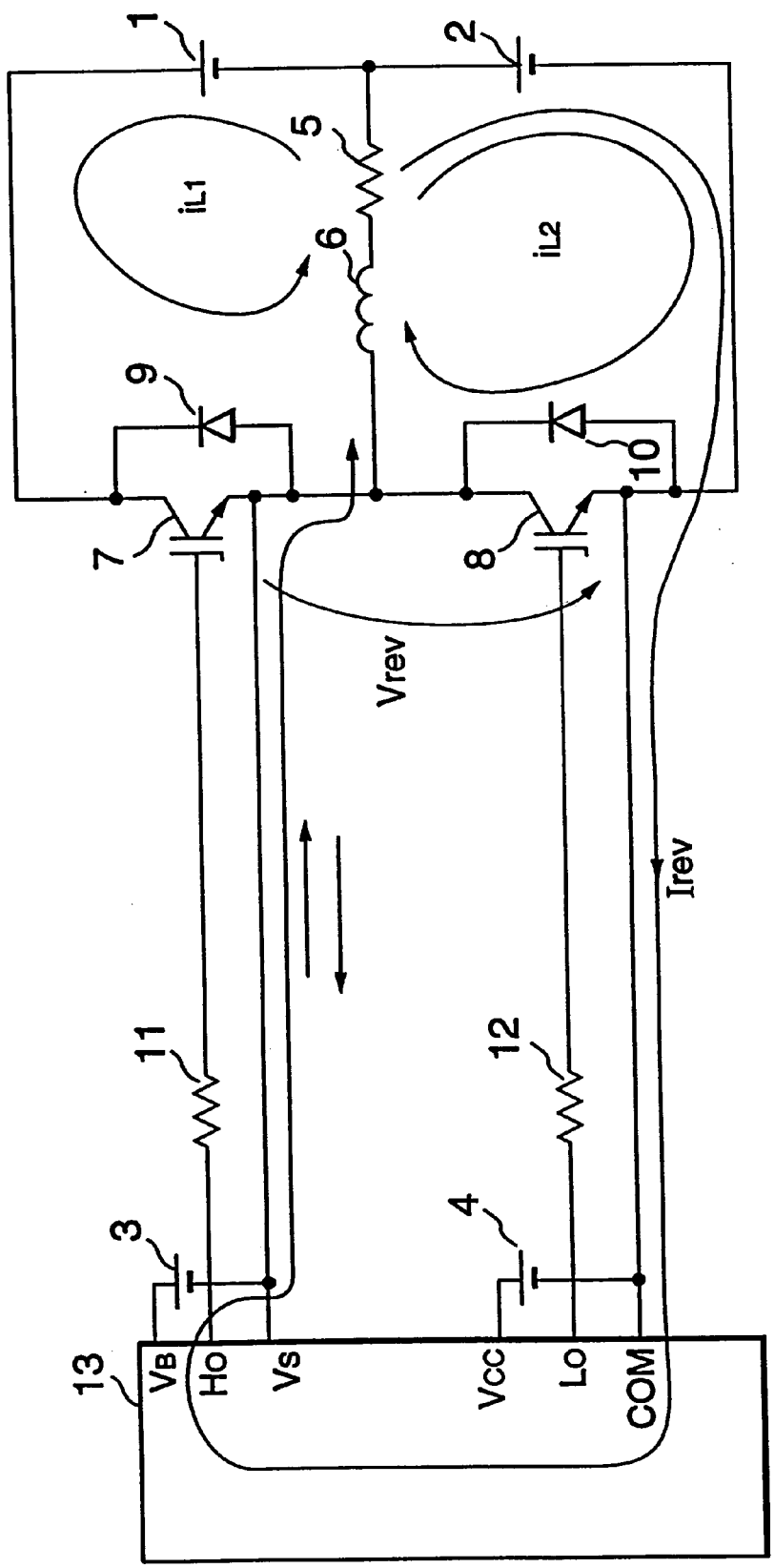
FIG. 36 is a diagram for indicating the current path when the IC is erroneously operated, or is electrically destroyed.
Figure 37:
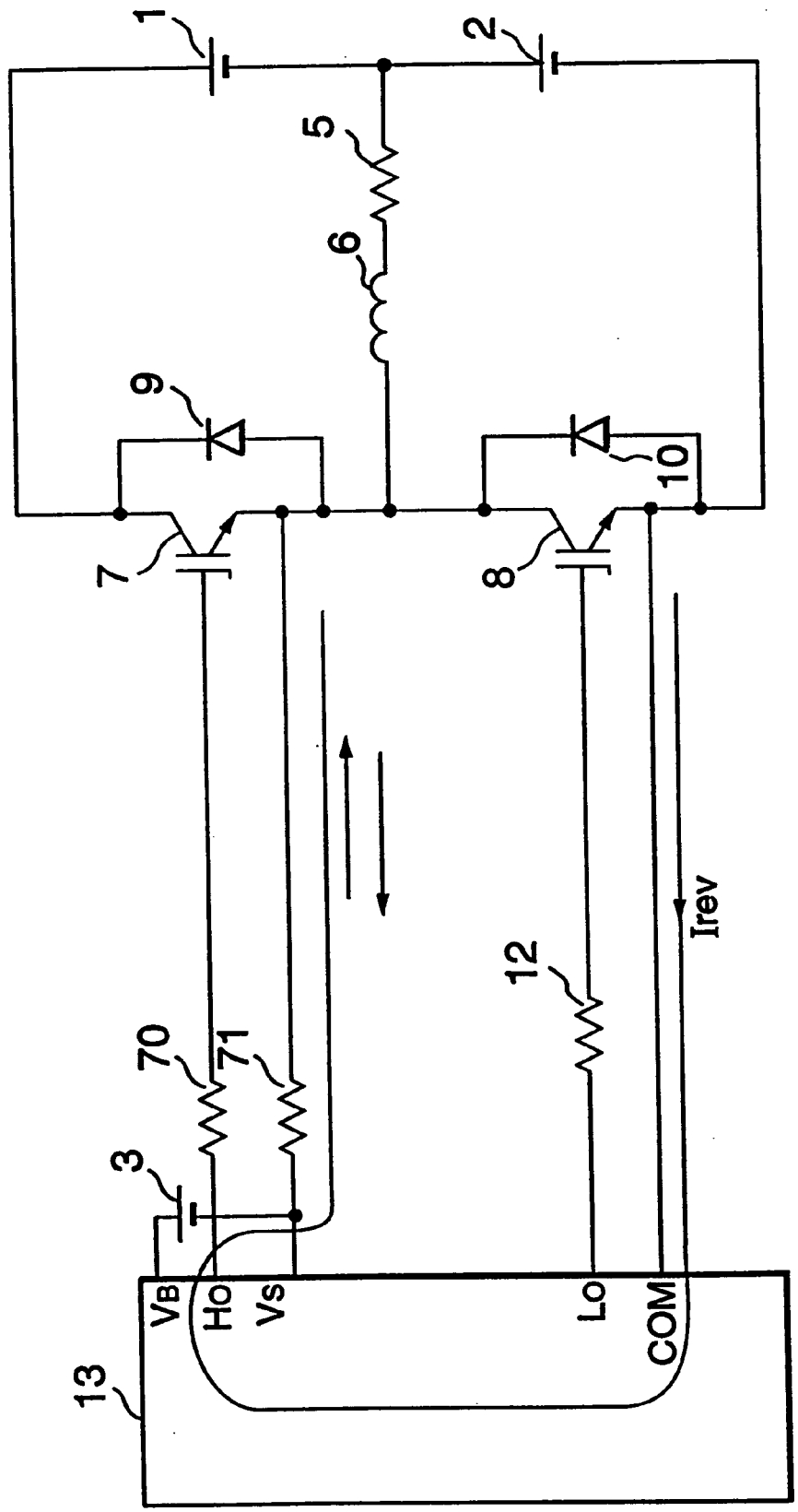
FIG. 37 is a diagram for representing the solving example executed in the conventional power converting apparatus.
Figure 38:
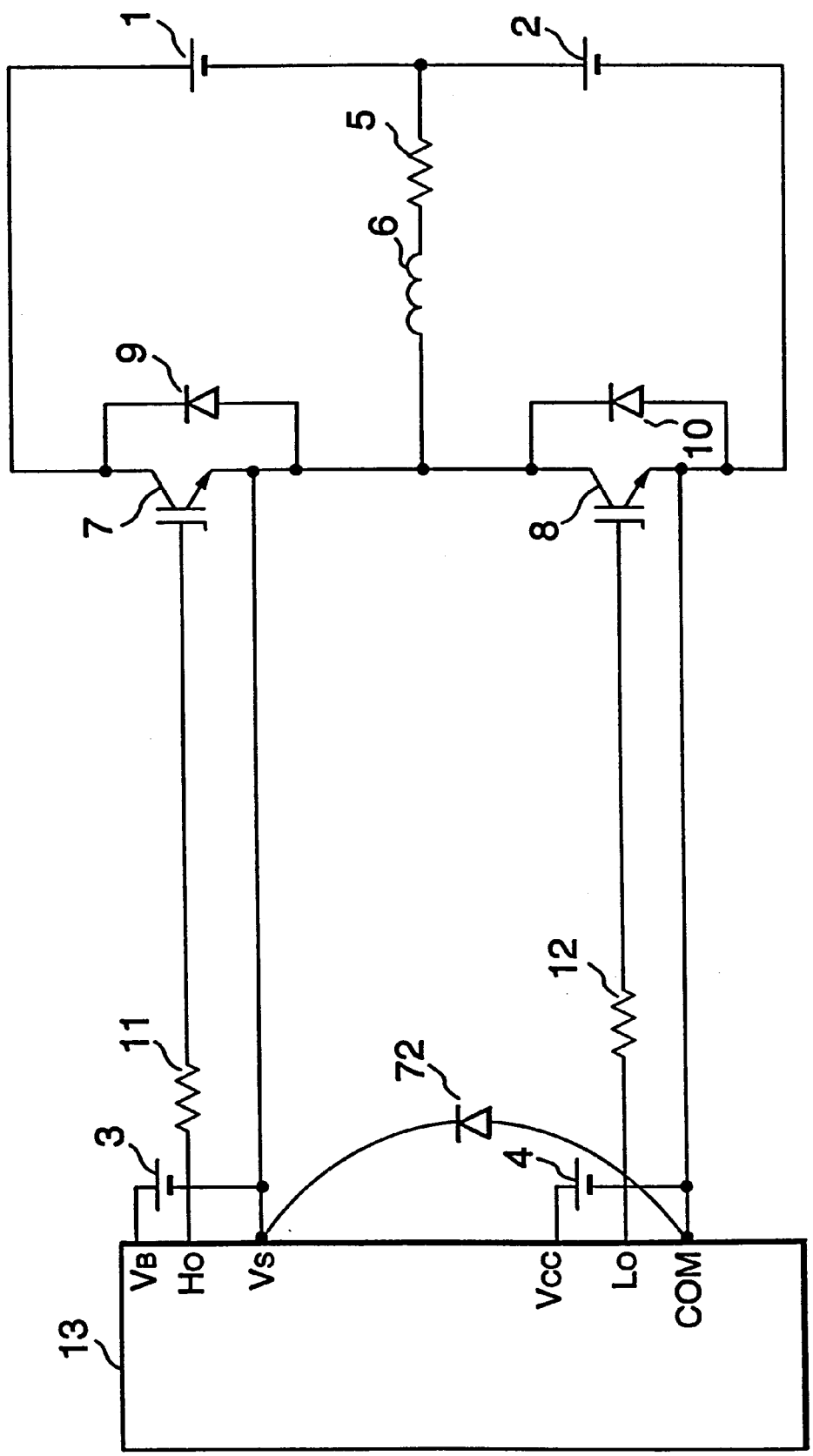
FIG. 38 is a diagram for representing the solving example executed in the conventional power converting apparatus.

The IC 304 owns three sets of the same functions as the IC 13. That is to say, an internal circuit for 1 set of the function is represented in a similar manner to that of FIG. 26. A mechanism is similar to that of FIG. 26, in which as indicated in FIG. 27, a voltage Vrev1 is produced and a current Irev1 flows, a voltage Vrev2 is produced and a current Irev2 flows, and a voltage Vrev3 is produced and a current Irev3 flows. Subsequently, a description will now be made of such a case that when the voltage Vrev1 is produced, the current Irev1 flows. Since operations as to the above-described current Irev2 and Irev3 are similar to the above operation, explanations thereof are omitted.

Figure 18:
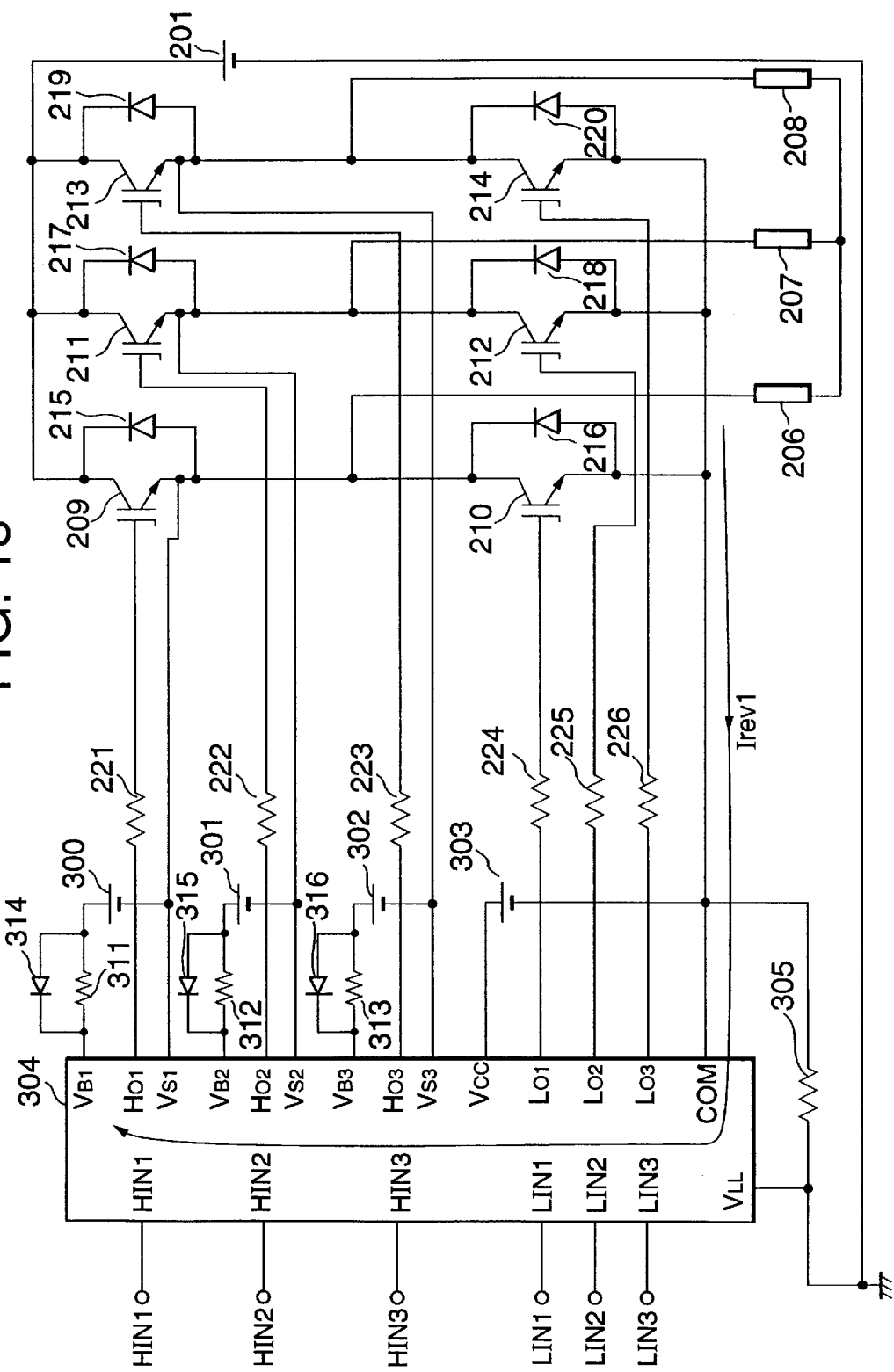
FIG. 18 is a circuit diagram for representing a power converting apparatus according to an embodiment 13.

FIG. 18 indicates a power converting apparatus according to a thirteenth embodiment of the present invention. In this drawing, reference numerals 201, 206 to 226, and 300 to 305 indicate the same circuit elements of FIG. 16, and explanations thereof are omitted. Reference numerals 311 to 313 indicate resistors, and reference numerals 314 to 316 represent diodes.

In the power converting apparatus with the above-described circuit arrangement, since the resistor 110 is present in the path through which the current Irev1 flows, this current Irev1 can be suppressed. As a result, it is possible to prevent the IC 13 from the erroneous operation and the electric destruction.

Also, since an impedance component is not newly added to a current path used to drive the switches 209, 211, and 213 under ON states, there is no delay in the drive speeds of the switches 209, 211, and 213. It is, of course, no problem in such a case that the switches 209, 211, and 213 are driven to the OFF states.

Also, since the above-described diode 314 is connected via the power supply 300 to the VB1-terminal of the IC 304 and the VS1-terminal thereof, such a diode having a low rating voltage may be used, so that a low-cost diode may be employed as the diode 314. Also, since the diode 315 is connected via the power supply 301 to the VB2-terminal of the IC 304 and the VS2-terminal thereof, and also the diode 316 is connected via the power supply 302 to the VB3-terminal of the IC 304 and the VS3-terminal thereof, such diodes having low rating voltage may be used, so that low-cost diodes may be employed as these diodes 315 and 316.

Also, in the drawing, apparently it may be arranged that the drive signal path (namely, terminal HO of IC 13—resistor 221—switch 209—terminal VS of IC 13) via the resistor 221 is connected under twist line condition for suppressing induction noise. Also, similarly, the drive signal path (namely, terminal HO of IC 240—resistor 222—switch 211—terminal VS of IC 240) via the resistor 222 may be connected under twist line condition for suppressing induction noise. Also, similarly, the drive path (terminal HO of IC 241—resistor 223—switch 213—terminal VS of IC 241) via the resistor 223 may be connected under twist line condition for suppressing induction noise.

EMBODIMENT 14

In the case that the above-described DC power supplies 300 to 202 are, for instance, such DC power supplies containing high frequency noise and high frequency ripples such as a switching power supply, there are some possibilities that decoupling capacitors having a small capacitance and a better high frequency characteristic are connected between the VB1-terminal and the VS1-terminal between the terminals VB2 and VS2, and between the terminals VB3 and VS3, corresponding to the power supply voltage terminals of the IC 304 in order not apply the noise and the ripple component. In this case, the current Irev1 will flow through the above-described decoupling capacitors, so that the IC 304 is erroneously operated, and is electrically destroyed.

Figure 19:
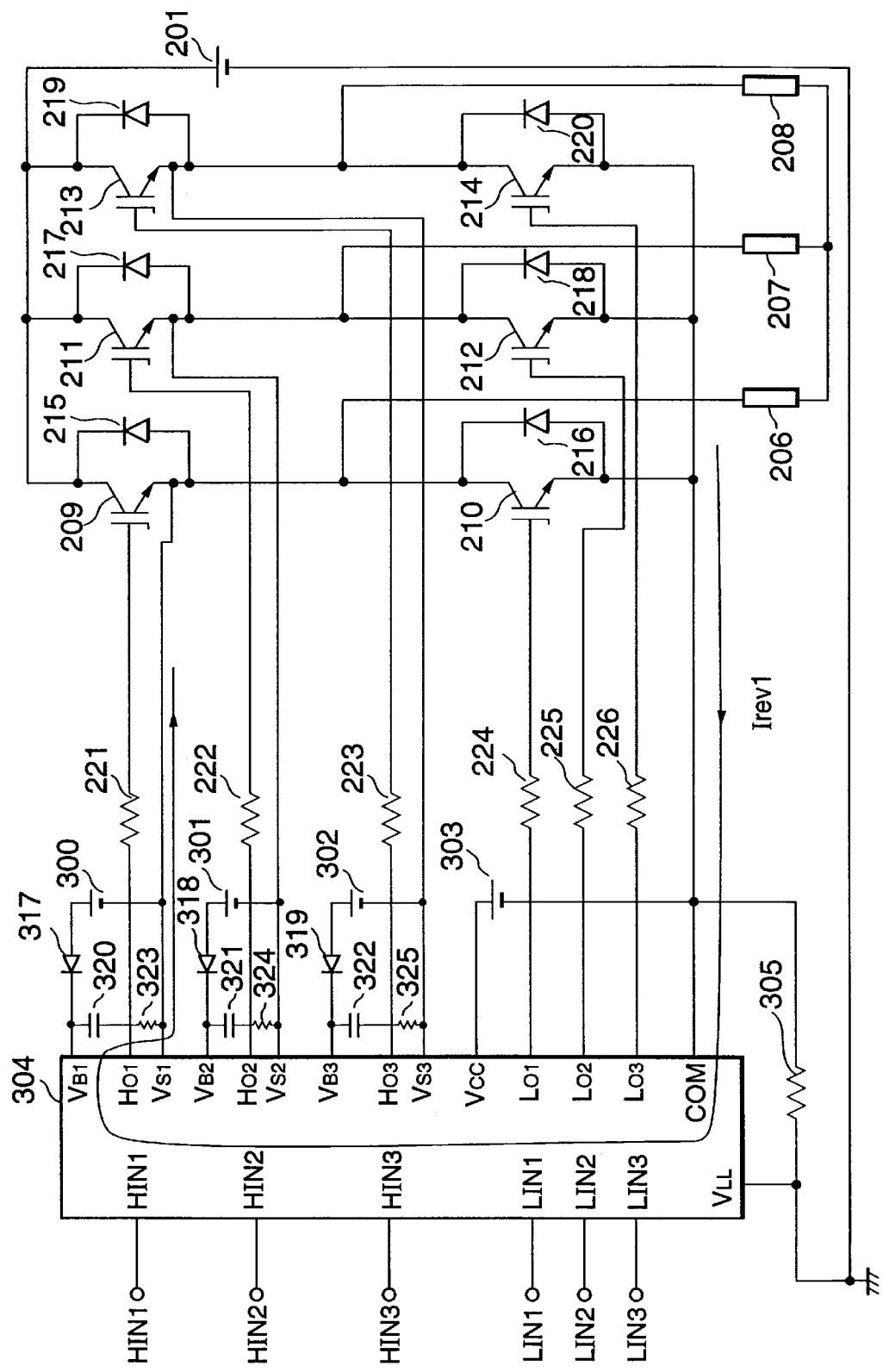
FIG. 19 is a circuit diagram for representing a power converting apparatus according to an embodiment 14.

FIG. 19 indicates a power converting apparatus according to a fifteenth embodiment of the present invention. In this drawing, reference numerals 201, 206 to 226, and 300 to 305 indicate the same circuit elements of FIG. 16, and explanations thereof are omitted. Reference numerals 317 to 319 indicate diodes, reference numerals 320 to 322 show capacitors functioning as decoupling capacitors, and reference numerals 323 to 325 are resistors.

The above-described current Irev1 is blocked by the diode 317, and there is no path through which the current passes via the DC power supply 300. As a consequence, the current Irev1 will flow via the capacitor 320. However, since the resistor 323 is present, the current Irev1 is suppressed, so that the erroneous operation of the IC 304 and the electric destruction thereof can be avoided. Also, if the resistance value of the resistor 323 may be set to a small value, then the impedance of the high frequency component with respect to the DC power supply 300 is not so increased. As a consequence, the high frequency noise and the high frequency ripple in the DC power supply 300 can be absorbed in the path of the capacitor 320 and the resistor 323.

Also, in the drawing, apparently it may be arranged that the drive signal path (namely, terminal HO of IC 304—resistor 221—switch 209—terminal VS of IC 304) via the resistor 221 is connected under twist line condition for suppressing induction noise. Also, similarly, the drive signal path (namely, terminal HO2 of IC 304—resistor 222—switch 211—terminal VS2 of IC 304) via the resistor 222 may be connected under twist line condition for suppressing induction noise. Also, similarly, the drive signal path (namely, terminal HO2 of IC 304—resistor 222—switch 211—terminal VS2 of IC 304) via the resistor 222 may be connected under twist line condition for suppressing induction noise. Also, similarly, the drive path (terminal HO3 of IC 304—resistor 223—switch 213 terminal VS3 of IC 304 via the resistor 223 may be connected under twist line condition for suppressing induction noise.

EMBODIMENT 15

Figure 20:
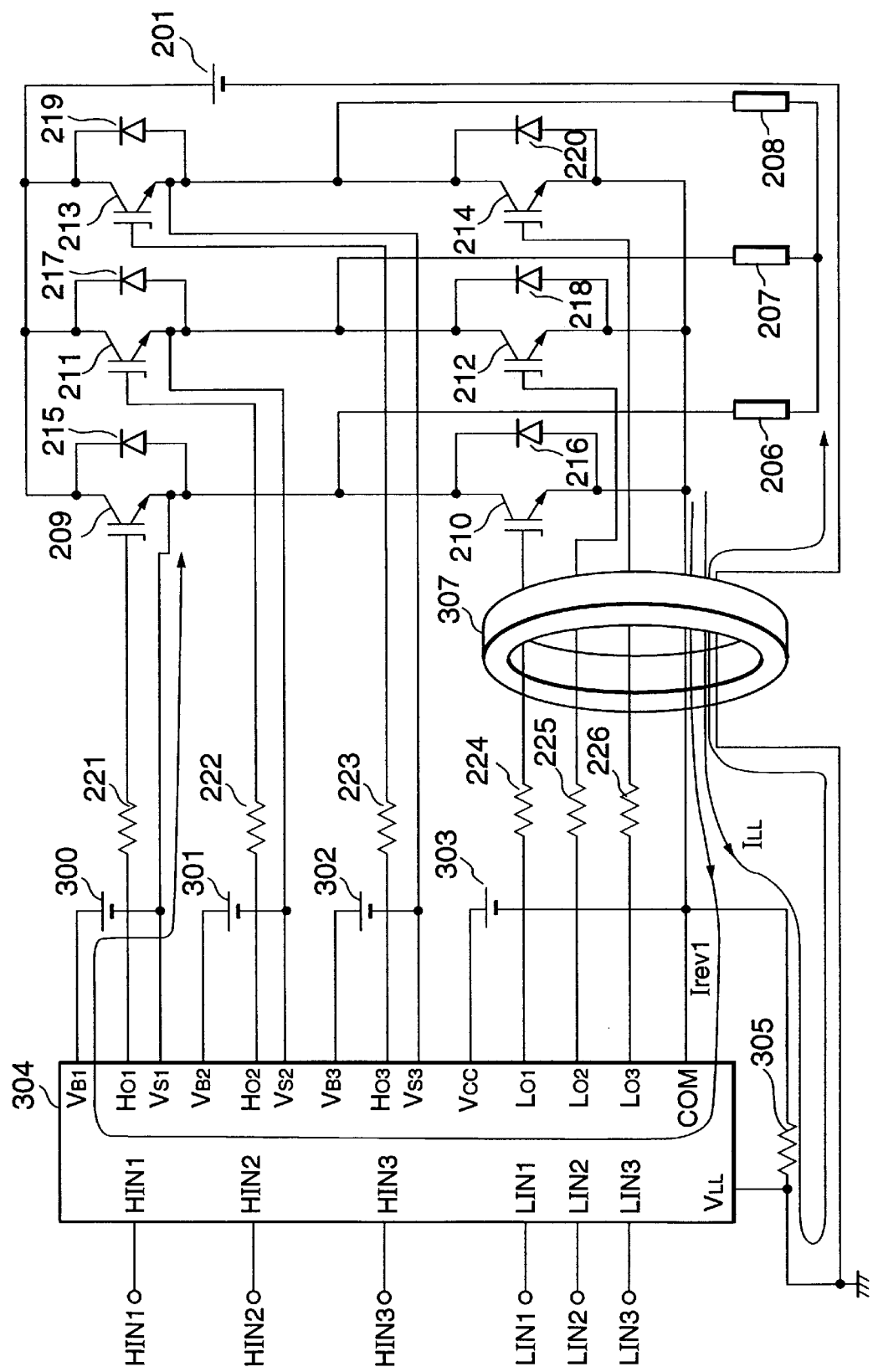
FIG. 20 is a circuit diagram for representing a power converting apparatus according to an embodiment 15.

FIG. 20 indicates a power converting apparatus according to a sixteenth embodiment of the present invention. In this drawing, reference numerals 201, 206 to 226, and 300 to 305 indicate the same circuit elements of FIG. 16, and explanations thereof are omitted. Reference numeral 307 indicates a core (common mode transformer) made of a material of, for example, ferrite and the like.

In the power converting apparatus with the above-described circuit arrangement, since the current Irev1 penetrates the core 307 by 1 time, the core 307 may function as an inductance component with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 304 from the erroneous operation and the electric destruction.

A current to drive the switches 210, 212, and 214 penetrates the core 307 by 1 time along different directions to each other. The magnetic fluxes produced within the core 307 are canceled with each other, so that the core 307 does not function as an inductance component. In other words, the delay in the drive speeds of the switches 210, 212, and 214 caused by connecting the above-explained core 307 is not produced, but also the erroneous operation of the IC 304 and also the electric destruction thereof can be prevented.

Also, since the above-described ILL penetrates the core 307 by 1 time along different directions to each other, and then the magnetic fluxes produced within the core 307 are canceled with each other, the above-described core 307 does not function as an inductance component. In other words, no adverse influence is given to the above-described ILL, which is caused by connecting the core 307.

Originally, since the above-described current Irev1 flows through the IC 304, and the current value is low, a low-cost core can be used as the core 307. Moreover, the magnetic fluxes produced by the current ILL within the core 307 are canceled with each other, such a low-cost core may be used.

Figure 21:
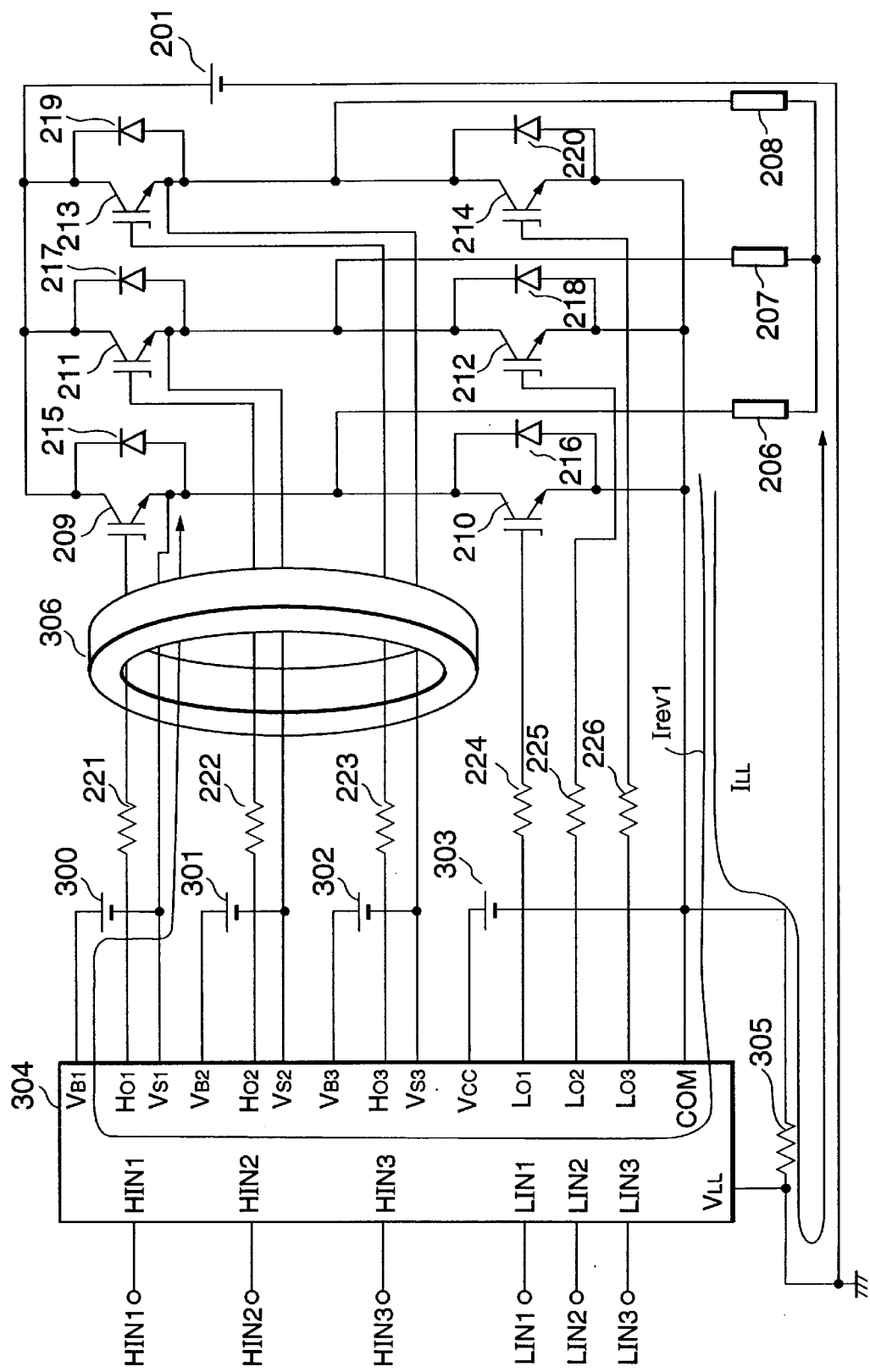
FIG. 21 is a circuit diagram for representing a power converting apparatus according to an embodiment 16.

Also, the power converting apparatus shown in FIG. 21 is arranged in such a manner that the current Irev1 penetrates the core 307 by 1 time. Alternatively, in general, it may be arranged such that the above-described current Irev1 may penetrate the core 307 by plural times.

Alternatively, although it is arranged by only one core in FIG. 21, it is apparently possible to arrange the power converting apparatus by employing a plurality of cores.

Also, in the drawing, apparently it may be arranged that the drive signal path (namely, terminal HO1 of IC 304—resistor 221—switch 209—terminal VS1 of IC 304) via the resistor 221 is connected under twist line condition for suppressing induction noise. Also, similarly, the drive signal path (namely, terminal HO2 of IC 304—resistor 222—switch 211—terminal VS2 of IC 304) via the resistor 222 may be connected under twist line condition for suppressing induction noise. Also, similarly, the drive path (terminal HO3 of IC 304 resistor 223—switch 213—terminal VS3 of IC 304) via the resistor 223 may be connected under twist line condition for suppressing induction noise.

EMBODIMENT 16

FIG. 21 indicates a power converting apparatus according to a sixteenth embodiment of the present invention. In this drawing, reference numerals 201, 206 to 226, and 300 to 305 indicate the same circuit elements of FIG. 16, and explanations thereof are omitted. Reference numeral 306 indicates a core (common mode transformer) made of a material of, for example, ferrite and the like.

In the power converting apparatus with the above-described circuit arrangement, since the current Irev1 penetrates the core 306 by 1 time, the core 306 may function as an inductance component with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 304 from the erroneous operation and the electric destruction.

A current to drive the switches 209, 211, and 213 penetrates the core 306 by 1 time along different directions to each other. The magnetic fluxes produced within the core 251 are canceled with each other, so that the core 306 does not function as an inductance component. In other words, the delay in the drive speeds of the switches 209, 211, and 213 caused by connecting the above-explained core 306 is not produced, but also the erroneous operation of the IC 304 and also the electric destruction thereof can be prevented.

Also, since the current ILL does not penetrate the core 306, there is no adverse influence given to the current flowing thorough the above-explained 3-phase power converting circuit. Furthermore, generally speaking, when the current ILL is a large current, the main circuit wiring line used to cause the above-described current ILL to pass therethrough is made wide. However, according to this embodiment, since the main circuit wiring line need not be connected to the core 306, the arrangement can be made easy.

Originally, since the above-described current Irev1 flows through the IC 304, and the current value is low, a low-cost core can be used as the core 306.

Also, the power converting apparatus shown in FIG. 18 is arranged in such a manner that the current Irev1 penetrates the core 306 by 1 time. Alternatively, in general, it may be arranged such that the above-described current Irev1 may penetrate the core 306 by plural times.

Alternatively, although it is arranged by only one core in FIG. 18, it is apparently possible to arrange the power converting apparatus by employing a plurality of cores.

Also, in the drawing, apparently it may be arranged that the drive signal path (namely, terminal HO1 of IC 304—resistor 221—switch 209—terminal VS1 of IC 304) via the resistor 221 is connected under twist line condition for suppressing induction noise. Also, similarly, the drive signal path (namely, terminal HO2 of IC 304—resistor 222—switch 211—terminal VS2 of IC 304) via the resistor 222 may be connected under twist line condition for suppressing induction noise. Also, similarly, the drive path (terminal HO3 of IC 304—resistor 223—switch 213—terminal VS3 of IC 304) via the resistor 223 may be connected under twist line condition for suppressing induction noise.

EMBODIMENT 17

Figure 22:
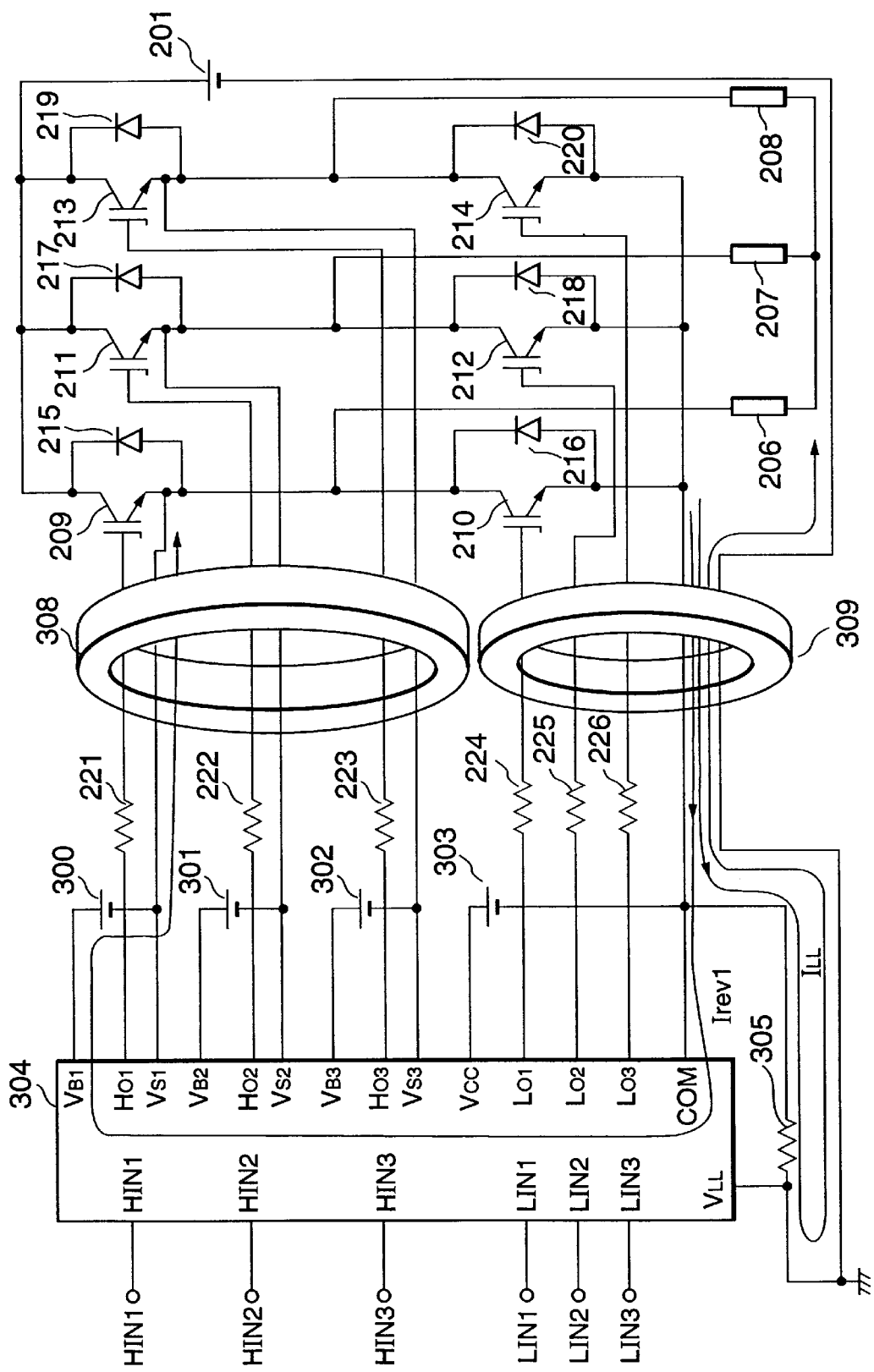
FIG. 22 is a circuit diagram for representing a power converting apparatus according to an embodiment 17.

FIG. 22 indicates a power converting apparatus according to a seventeenth embodiment of the present invention. In this drawing, reference numerals 201, 206 to 226, and 300 to 305 indicate the same circuit elements of FIG. 16, and explanations thereof are omitted. Reference numerals 308 and 309 indicate cores (common mode transformers) made of a material of, for example, ferrite and the like.

In the power converting apparatus with the above-described circuit arrangement, since the current Irev1 penetrates the core 308 by 1 time and the core 309 by 1 time, the cores 308 and 309 may function as inductance components with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 304 from the erroneous operation and the electric destruction.

A current used to drive the switches 209, 211, and 213 penetrates the core 308 by 1 time along different directions to each other. The magnetic fluxes produced within the core 308 are canceled with each other, so that the core 308 does not function as an inductance component. In other words, the delay in the drive speeds of the switches 209, 211, and 213 caused by connecting the above-explained core 308 is not produced, but also the erroneous operation of the IC 304 and also the electric destruction thereof can be prevented.

Also, a current used to drive the switches 210, 212, and 214 penetrates the core 309 by 1 time along different directions to each other. The magnetic fluxes produced within the core 309 are canceled with each other, so that the core 309 does not function as an inductance component. In other words, the delay in the drive speeds of the switches 210, 212, and 214 caused by connecting the above-explained core 309 is not produced, but also the erroneous operation of the IC 304 and also the electric destruction thereof can be prevented.

Also, the above-described current ILL penetrates the core 309 by 1 time along different directions to each other, and the magnetic fluxes produced within the core 309 are canceled with each other, so that the core 309 does not function as an inductance component. In other words, there is no adverse influence caused by connecting the core 309 with respect to the above-described current ILL.

Originally, since the above-described current Irev1 flows through the IC 304, and the current value is low, a low-cost core can be used as the core 308. Furthermore, since the magnetic fluxes produced by the above-explained current ILL within the core 309, a low-cost core can also be used as the core 309.

It should be understood that the power converting apparatus of FIG. 22 is so arranged by that the current Irev1 penetrates the core 308 and the core 309 by 1 time. Alternatively, in general, it may be arranged such that the above-described current Irev1 may penetrate the cores 308 and 309 plural times.

Furthermore, although the power converting apparatus is arranged by employing only one core, respectively, in FIG. 22, it may be arranged by using a plurality of the above-explained cores.

Also, in the drawing, apparently it may be arranged that the drive signal path (namely, terminal HO1 of IC 304—resistor 221—switch 209—terminal VS1 of IC 304) via the resistor 221 is connected under twist line condition for suppressing induction noise. Also, similarly, the drive signal path (namely, terminal HO2 of IC 304—resistor 222—switch 211—terminal VS2 of IC 304) via the resistor 222 may be connected under twist line condition for suppressing induction noise. Also, similarly, the drive path (terminal HO3 of IC 304—resistor 223—switch 213—terminal VS3 of IC 304) via the resistor 223 may be connected under twist line condition for suppressing induction noise.

EMBODIMENT 18

Figure 23:
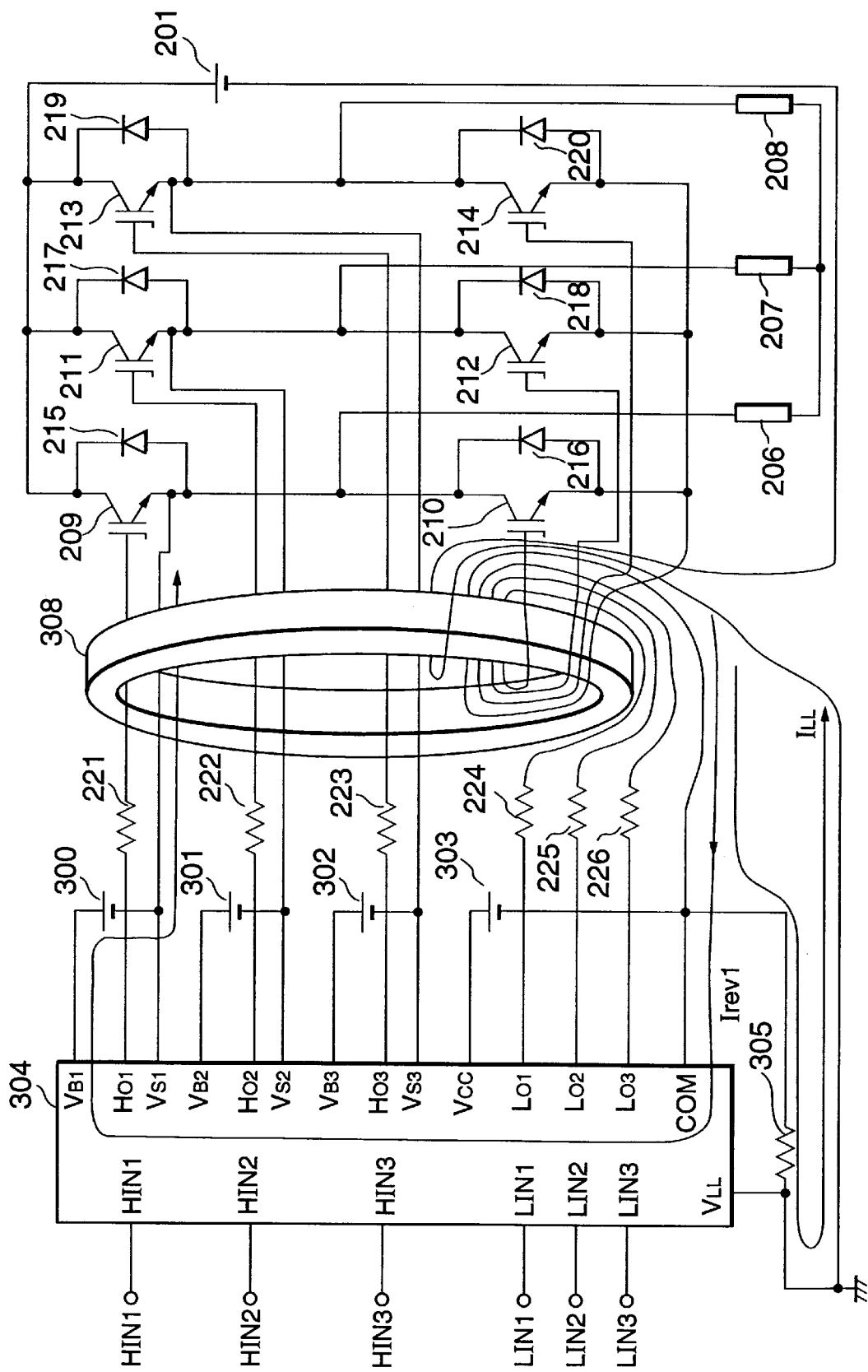
FIG. 23 is a circuit diagram for representing a power converting apparatus according to an embodiment 18.
Figure 24:
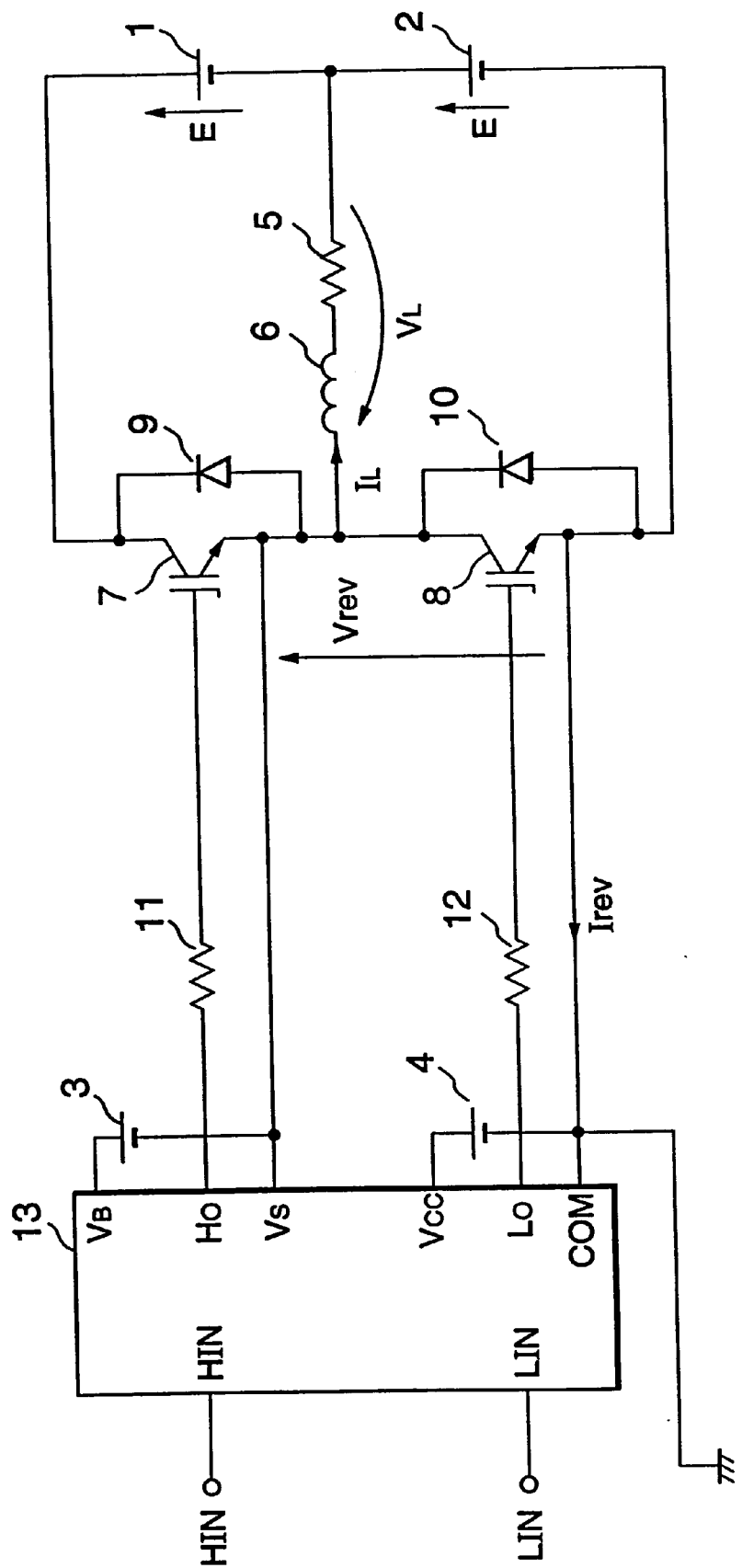
FIG. 24 is a circuit diagram for indicating the conventional power converting apparatus.
Figure 25:
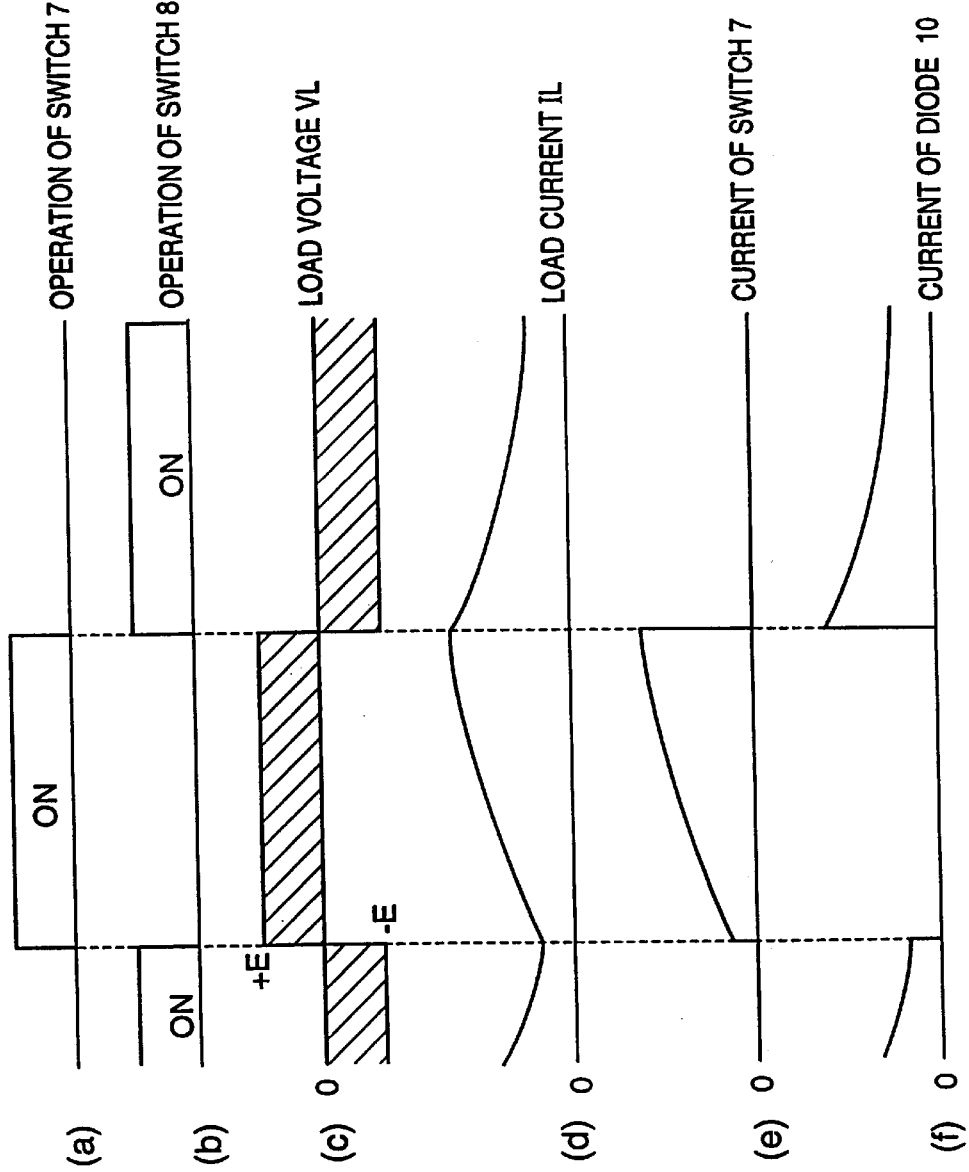
FIG. 25 is a diagram for showing the switch operation of the conventional power converting apparatus, and the waveforms of the voltage and the current.

FIG. 23 indicates a power converting apparatus according to an eighteenth embodiment of the present invention. In this drawing, reference numerals 201, 206 to 226, and 300 to 305 indicate the same circuit elements of FIG. 16, and explanations thereof are omitted. Reference numeral 310 indicates a core (common mode transformer) made of a material of, for example, ferrite and the like.

In the power converting apparatus with the above-described circuit arrangement, since the current Irev1 penetrates the core 310 by 2 times, the core 310 may function as an inductance component with respect to the current Irev1. In other words, the impedance of the signal path of the above-explained Irev1 is increased.

When the impedance of the signal path of the current Irev1 is increased, this current Irev1 can be suppressed. As a result, it is possible to prevent the IC 304 from the erroneous operation and the electric destruction.

A current used to drive the switches 209, 211, and 213 penetrates the core 310 by 1 time along different directions to each other. The magnetic fluxes produced within the core 310 are canceled with each other, so that the core 310 does not function as an inductance component. In other words, the delay in the drive speeds of the switches 209, 211, and 213 caused by connecting the above-explained core 310 is not produced, but also the erroneous operation of the IC 304 and also the electric destruction thereof can be prevented.

Also, a current used to drive the switches 210, 212, and 214 penetrates the core 310 by 1 time along different directions to each other. The magnetic fluxes produced within the core 310 are canceled with each other, so that the core 310 does not function as an inductance component. In other words, the delay in the drive speeds of the switches 210, 212, and 214 caused by connecting the above-explained core 310 is not produced, but also the erroneous operation of the IC 304 and also the electric destruction thereof can be prevented.

Also, the above-described current ILL penetrates the core 310 by 1 time along different directions to each other, and the magnetic fluxes produced within the core 310 are canceled with each other, so that the core 310 does not function as an inductance component. In other words, there is no adverse influence caused by connecting the core 310 with respect to the above-described current ILL.

Originally, since the above-described current Irev1 flows through the IC 304, and the current value is low, a low-cost core can be used as the core 105. Furthermore, since the magnetic fluxes produced by the above-explained current ILL within the core 310, a low-cost core can also be used as the core 310.

It should be understood that the power converting apparatus of FIG. 23 is so arranged by that the current Irev1 penetrates the core 310 by 2 times. Alternatively, in general, it may be arranged such that the above-described current Irev1 may penetrate the core 310 plural times.

Furthermore, although the power converting apparatus is arranged by employing only one core, respectively, in FIG. 23, it may be arranged by using a plurality of the above-explained cores.

Also, under such a condition that only one core is used due to low cost and also, as represented in FIG. 2, the same drive wiring line cannot penetrate such a single core by more than 2 times because of the arrangement of the power converting apparatus, only such an impedance of a single core is merely obtained with respect to the current Irev in the embodiments 7 to 9. To the contrary, according to this embodiment, since the impedance for two sets of cores can be obtained, the currents Irev1 to Irev3 can be furthermore suppressed.

Also, in the drawing, apparently it may be arranged that the drive signal path (namely, terminal HO1 of IC 304—resistor 221—switch 209—terminal VS1 of IC 304) via the resistor 221 is connected under twist line condition for suppressing induction noise. Also, similarly, the drive signal path (namely, terminal HO2 of IC 304—resistor 222—switch 211—terminal VS2 of IC 304) via the resistor 222 may be connected under twist line condition for suppressing induction noise. Also, similarly, the drive path (terminal HO3 of IC 304 resistor 223—switch 213—terminal VS3 of IC 304) via the resistor 223 may be connected under twist line condition for suppressing induction noise.

As previously described, the present invention may achieve the below-mentioned effects.

The power converting apparatus, according to the present invention, is comprised of: an electric valve group containing a first electric valve and a second electric valve, which have first terminals, second terminals, and third terminals, and in which the first terminals and the third terminals are opened/closed by supplying an electric signal between the second terminals and the third terminals, and also the first electric valve is series-connected to the second electric valve; a power supply group containing a first power supply and a second power supply series-connected to the first power supply, the power supply group being connected in parallel to the electric valve group; a load connected between a junction point defined by the first electric valve and the second electric valve, and another junction point defined by the first power supply and the second power supply; control means connected to the second terminals in the first and second electric valves and also to the third terminals in the first and second electric valves, for opening/closing the first and second electric valves in a complementary manner; a third power supply, one end of which is connected to the control means, and the other end of which is connected to the third terminal in the first electric valve; a fourth power supply, one end of which is connected to the control means, and the other end of which is connected to the third terminal in the second valve; and impedance increasing means for increasing an impedance of a signal path defined from the third terminal in the second electric valve via the control means and the third power supply to the third terminal in the electric valve. As a result, it is possible to suppress the current flowing through the signal path defined from the third terminal in the second electric valve via the control means and the third power supply to the third terminal in the first electric valve, and also it is possible to prevent the control means from the erroneous operation and the electric destruction.

Also, since the impedance increasing means is the transformer, this impedance increasing means can be easily constructed.

Furthermore, the transformer is hollow; and a line used to connect the second terminal in the second electric valve with the control means and another line used to connect the third terminal in the second electric valve with the control means are provided in such a manner that both the lines penetrate the hollow of the transformer. As a consequence, it is possible to suppress the current flowing through the signal path defined from the third terminal in the second electric valve via the control means and the third power supply to the third terminal in the first electric valve, and also the erroneous operation and the electric destruction of the control means can be avoided.

Furthermore, the transformer is hollow; and a line used to connect the second terminal in the first electric valve with the control means and another line used to connect the third terminal in the first electric valve with the control means are provided in such a manner that both the lines penetrate the hollow of the transformer. As a consequence, it is possible to suppress the current flowing through the signal path defined from the third terminal in the second electric valve via the control means and the third power supply to the third terminal in the first electric valve, and also the erroneous operation and the electric destruction of the control means can be avoided.

Also, the line used to connect the second terminal in the second electric valve with the control means and the line used to connect the third terminal in the second electric valve with the control means are provided in such a manner that both the lines penetrate the hollow of the transformer plural times. As a consequence, it is possible to further suppress the current flowing through the signal path defined from the third terminal in the second electric valve via the control means and the third power supply to the third terminal in the first electric valve.

Moreover, the line used to connect the second terminal in the first electric valve with the control means and the line used to connect the third terminal in the first electric valve with the control means are provided in such a manner that both the lines penetrate the hollow of the transformer plural times. As a consequence, it is possible to further suppress the current flowing through the signal path defined from the third terminal in the second electric valve via the control means and the third power supply to the third terminal in the first electric valve.

Furthermore, the transformer is hollow; and a line used to connect the second terminal in the first electric valve with the control means, another line used to connect the third terminal in the first electric valve with the control means, another line used to connect the second terminal in the second electric valve with the control means, and another line used to connect the third terminal in the second electric valve with the control means are provided in such a manner that the lines penetrate the hollow of the transformer. As a consequence, it is possible to further suppress the current flowing through the signal path defined from the third terminal in the second electric valve via the control means and the third power supply to the third terminal in the first electric valve.

Also, since the impedance increasing means is the resistor, this impedance increasing means can be simply provided within a small space.

Moreover, since the third power supply is connected via the resistor to the control means, this resistor can suppress the current flowing through the signal path defined from the third terminal in the second electric valve via the control means and the third power supply to the third terminal in the first electric valve.

Also, since the power converting apparatus is comprised of a diode connected in parallel to the resistor, the current from the third power supply to the control means can be properly supplied via the diode.

Also, the impedance increasing means includes: a diode series-connected between the control means and the third power supply; a capacitor connected in parallel to the diode and the third power supply; and a resistor series-connected to the capacitor and also connected in parallel to both the diode and the third power supply. As a consequence, it is possible to suppress the current flowing through the signal path defined from the third terminal in the second electric valve via the control means and the third power supply to the third terminal in the first electric valve.

The power converting apparatus, according to the present invention, is comprised of: a first electric valve provided so as to supply power from a first power supply to a load; a second electric valve provided so as to supply power from a second power supply to the load; control means for controlling a switching operation of conducting the first electric valve and the second electric valve in a complementary manner by supplying a switching control signal to a control electrode of the first electric valve and also to a control electrode of the second electric valve; a third power supply connected between one of main electrodes of the first electric valve and the control means; a fourth power supply connected between one of main electrodes of the second electric valve and the control means; and impedance increasing means provided in a series circuit constituted by a main electrode of the second electric valve, the control means, the third power supply, and a main electrode of the first electric valve, for increasing an impedance of the series circuit. As a consequence, it is possible to suppress the current flowing through the series circuit, and also, the erroneous operation and the malfunction of the control means can be prevented.

INDUSTRIAL UTILIZATION

As previously described, the power converting apparatus according to the present invention is suitably used as the power switching element and the power converting apparatus for driving this power switching element.

What is claimed is:

1. A power converting apparatus comprising:
    an electric valve group containing a first electric valve and a second electric valve, which have first terminals, second terminals, and third terminals, and in which said first terminals and said third terminals are opened/closed by supplying an electric signal between said second terminals and said third terminals, and also said first electric valve is series-connected to said second electric valve;
    a power supply group containing a first power supply and a second power supply series-connected to said first power supply, said power supply series-connected to said first power supply, said power supply group being connected in parallel to said electric valve group;
    a load connected between a junction point defined by the connection of said first electric valve and said second electric valve, and another junction point defined by the connection of said first power supply and said second power supply;
    control means connected to the second terminals of said first and second electric valves and also to the third terminals of said first and second electric valves, for opening/closing said first and second electric valves in a complementary manner;
    a third power supply, one end of which is connected to said control means, and the other end of which is connected to the third terminal in said first electric valve;
    a fourth power supply, one end of which is connected to said control means, and the other end of which is connected to said third terminal in said second valve; and
    impedance increasing means for increasing an impedance of a signal path defined from the third terminal in said second electric valve via said control means and said third power supply to the third terminal in said electric valve.

2. A power converting apparatus as claimed in claim 1 wherein:
    said impedance increasing means is a transformer.

3. A power converting apparatus as claimed in claim 2 wherein:
    said transformer is hollow; and a line used to connect said second terminal in said second electric valve with said control means and another line used to connect said third terminal in said second electric valve with said control means are provided in such a manner that both said lines penetrate the hollow of said transformer.

4. A power converting apparatus as claimed in claim 2 wherein:
    said transformer is hollow; and a line used to connect said second terminal in said first electric valve with said control means and another line used to connect said third terminal in said first electric valve with said control means are provided in such a manner that both said lines penetrate the hollow of said transformer.

5. A power converting apparatus as claimed in claim 3 wherein:
    the line used to connect said second terminal in said second electric valve with said control means and the line used to connect said third terminal in said second electric valve with said control means are provided in such a manner that both said lines penetrate the hollow of said transformer plural times.

6. A power converting apparatus as claimed in claim 4 wherein:
    the line used to connect said second terminal in said first electric valve with said control means and the line used to connect said third terminal in said first electric valve with said control means are provided in such a manner that both said lines penetrate the hollow of said transformer plural times.

7. A power converting apparatus as claimed in claim 2 wherein:
    said transformer is hollow; and a line used to connect the second terminal in said first electric valve with said control means, another line used to connect the third terminal in said first electric valve with said control means, another line used to connect the second terminal in said second electric valve with said control means, and another line used to connect the third terminal in said second electric valve with said control means are provided in such a manner that said lines penetrate the hollow of said transformer.

8. A power converting apparatus as claimed in claim 1 wherein:
    said impedance increasing means is a resistor.

9. A power converting apparatus as claimed in claim 8 wherein:
    said third power supply is connected via said resistor to said control means.

10. A power converting apparatus as claimed in claim 9 further comprising:
    a diode connected in parallel to said resistor.

11. A power converting apparatus as claimed in claim 1 wherein:
    said impedance increasing means includes:
        a diode series-connected between said control means and said third power supply;
        a capacitor connected in parallel to the series connection of said diode and said third power supply; and
        a resistor series-connected to said capacitor and also connected in parallel to the series connection of said diode and said third power supply.

12. A power converting apparatus comprising:
    a first electric valve provided so as to supply power from a first power supply to a load;
    a second electric valve provided so as to supply power from a second power supply to said load;
    control means for controlling a switching operation of said first electric valve and said second electric valve in a complementary manner by supplying a switching control signal to a control electrode of said first electric valve and also to a control electrode of said second electric valve;
    a third power supply connected between one of main electrodes of said first electric valve and said control means;
    a fourth power supply connected between one of main electrodes of said second electric valve and said control means; and
    impedance increasing means provided in a series circuit constituted by a main electrode of said second electric valve, said control means, said third power supply, and a main electrode of said first electric valve, for increasing an impedance of said series circuit.

13. A power converting apparatus as claimed in claim 12 wherein:
    said first power supply is identical to said second power supply.

* * * * *